(12) United States Patent
Matsuda et al.

(10) Patent No.: US 7,202,590 B2
(45) Date of Patent: Apr. 10, 2007

(54) SURFACE ACOUSTIC WAVE DEVICE AND METHOD OF MANUFACTURING THE SAME

(75) Inventors: Takashi Matsuda, Kawasaki (JP); Michio Miura, Kawasaki (JP); Yoshio Satoh, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/840,632

(22) Filed: May 7, 2004

(65) Prior Publication Data
US 2004/0222717 A1 Nov. 11, 2004

(30) Foreign Application Priority Data
May 9, 2003 (JP) ............................. 2003-131003

(51) Int. Cl.
*H03H 9/25* (2006.01)
(52) U.S. Cl. ..................... 310/313 R; 310/313 B; 310/313 D; 333/198; 333/195
(58) Field of Classification Search .............. 310/313; 333/195–198
See application file for complete search history.

(56) References Cited

U.S. PATENT DOCUMENTS

| | | | | |
|---|---|---|---|---|
| 5,932,950 | A | * 8/1999 | Yamada et al. | 310/313 D |
| 6,320,295 | B1 | * 11/2001 | McGill et al. | 310/313 R |
| 6,445,265 | B1 | 9/2002 | Wright | 333/193 |
| 6,637,087 | B1 | * 10/2003 | Horiuchi et al. | 29/25.35 |

FOREIGN PATENT DOCUMENTS

| JP | 58-26220 | 2/1983 |
|---|---|---|
| JP | 3-101280 | 4/1991 |
| JP | 4-109709 | 4/1992 |
| JP | 6-112764 | 4/1994 |
| JP | 7-16427 | 3/1995 |
| JP | 2516817 | 4/1996 |
| JP | 8-237065 A | 9/1996 |
| JP | 9-208399 | 8/1997 |

(Continued)

OTHER PUBLICATIONS

"SAW Properties of $SiO_2/128°$ $Y$-$X$ $LiNbO_3$ Structure Fabricated by Magnetron Sputtering Technique," Kazuhiko Yamanouchi et al., *IEEE Transactions on Sonics and Ultrasonics*, vol. SU-31, No. 1, Jan. 1984, pp. 51-57.

"Temperature Stable SAW Devices Using Directly Bonded $LiTaO_3$/Glass Substrates," H. Sato et al., 1998 *IEEE Ultrasonics Symposium*, pp. 335-338.

(Continued)

*Primary Examiner*—Darren Schuberg
*Assistant Examiner*—J. Aguirrechea
(74) *Attorney, Agent, or Firm*—Arent Fox LLP

(57) ABSTRACT

A surface acoustic wave device includes: a piezoelectric substrate that has two or more resonators formed on a surface; and a supporting substrate that is joined to another surface of the piezoelectric substrate. In this surface acoustic wave device, at least two of the resonators have exciting portions that overlap each other in the direction of propagating surface acoustic waves, and at least a part of the piezoelectric substrate is removed or modified to have different properties between at least one pair of overlapping resonators among the resonators having the overlapping portions.

6 Claims, 24 Drawing Sheets

FOREIGN PATENT DOCUMENTS

| | | |
|---|---|---|
| JP | 11-97973 | 4/1999 |
| JP | 11-55070 | 12/1999 |
| JP | 2001-60846 | 3/2001 |
| JP | 2001-345658 | 12/2001 |
| JP | 2002-534886 | 10/2002 |
| KR | 2000-0014587 A | 3/2000 |

OTHER PUBLICATIONS

"Theoretical Analysis of SAW Propagation Characteristics under the Strained Medium and Applications for High Temperature Stable High Coupling SAW Substrates," K. Yamanouchi et al., 1999 *IEEE Ultrasonics Symposium*, pp. 239-242, with Japanese translation pp. 51-52.

* cited by examiner

SAW PROPAGATING DIRECTION

SAW PROPAGATING DIRECTION

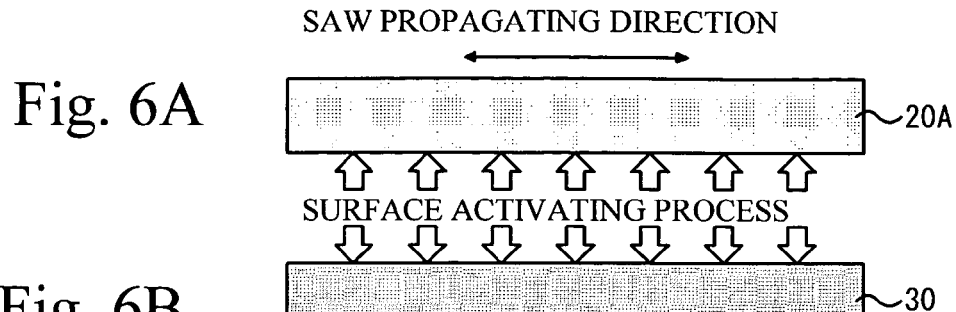
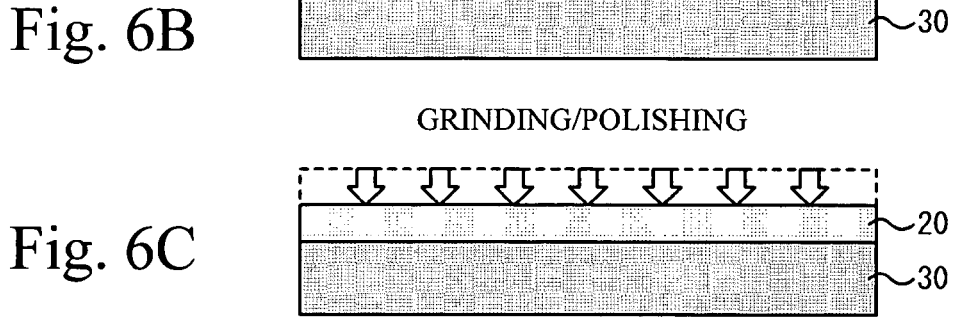
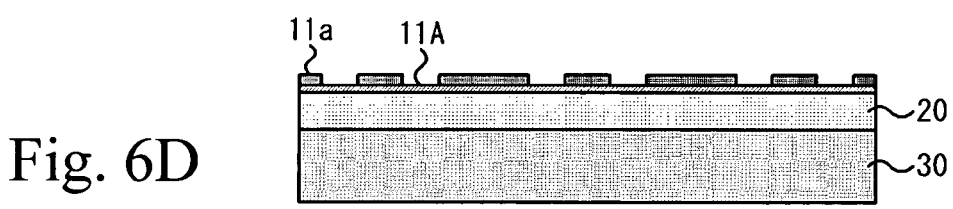
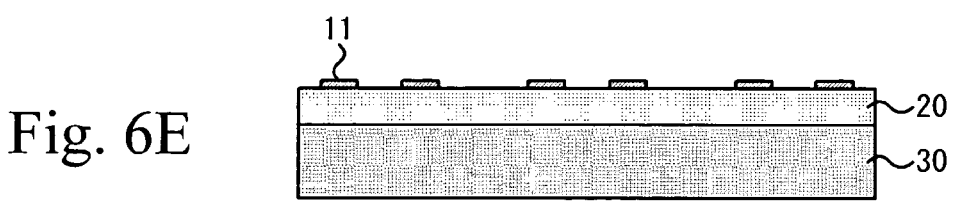
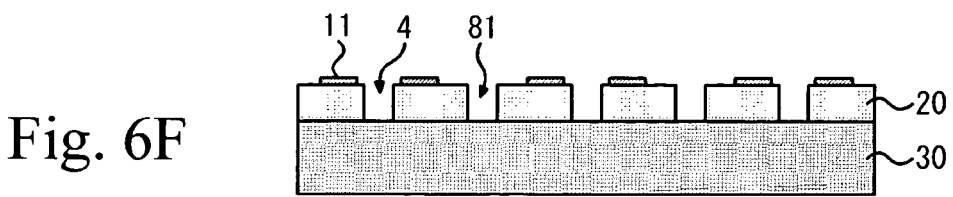
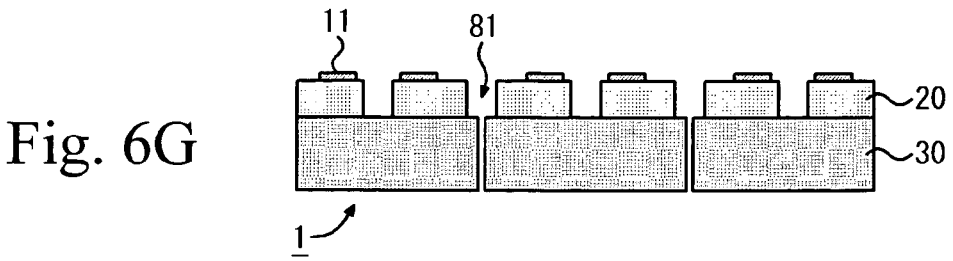

SAW PROPAGATING DIRECTION

SAW PROPAGATING DIRECTION

HEATING PROCESS

SAW PROPAGATING DIRECTION

SAW PROPAGATING DIRECTION

SAW PROPAGATING DIRECTION

SAW PROPAGATING DIRECTION

SAW PROPAGATING DIRECTION

SAW PROPAGATING DIRECTION

SAW PROPAGATING DIRECTION

SAW PROPAGATING DIRECTION

SAW PROPAGATING DIRECTION

SAW PROPAGATING DIRECTION

C-AXIS PROJECTION LINE OF SAPPHIRE
SUBSTRATE 3 OR DIRECTION
PERPENDICULAR TO THAT LINE

SURFACE ACOUSTIC WAVE DEVICE AND METHOD OF MANUFACTURING THE SAME

BACKGROUND OF THE INVENTION

1. Field of the Invention

The present invention relates to a surface acoustic wave (hereinafter referred to as SAW) device that includes a joined substrate having a supporting substrate joined to a piezoelectric element substrate, and a method of manufacturing the SAW device.

2. Description of the Related Art

Surface acoustic wave (SAW) devices are being widely used today as bandpass filters for portable telephone devices or the like. Filters and resonators that utilize SAW devices are characteristically small in size and inexpensive. Therefore, SAW devices have become essential for small-sized communication devices such as cellular phones.

As cellular phones have become more and more sophisticated in recent years, there is an increasing demand for more sophisticated filters utilizing SAW devices. Since a SAW device normally exhibits variations in frequency with changes in temperature, the stability with temperature is expected to improve.

Conventionally, substrate materials for SAW devices include piezoelectric element substrates (hereinafter referred to as piezoelectric substrates). Particularly, lithium tantalate (hereinafter referred to as LT) and lithium niobate (hereinafter referred to as LN) are piezoelectric materials with large electric mechanical coupling coefficients, and are being widely used accordingly.

The piezoelectric materials such as LT and LN with large electric mechanical coupling coefficients, however, have a drawback in that the substrate characteristics are unstable with changes in temperature. On the other hand, piezoelectric materials such as crystal with excellent stability with temperature have a drawback in having small electric mechanical coupling coefficients. In general, the piezoelectric materials with large electric mechanical coupling coefficients have poor stability with temperature, while the piezoelectric materials such as crystal with excellent stability with temperature have small electric mechanical coupling coefficients. In view of this, a SAW device that includes a substrate made of LT (hereinafter referred to as "LT substrate") can achieve wide-band filter characteristics, but is poorer in temperature stability than a crystal substrate or the like.

So as to compensate for the two contrary drawbacks and to realize a piezoelectric substrate that has a large electric mechanical coefficient and exhibits excellent stability with temperature, various techniques have been suggested. Yamanouchi, et al., IEEE Trans. on Sonics and Ultrasonics., vol. SU-31, pp. 51–57, 1984 (hereinafter referred to as Non-Patent Document 1), for example, discloses a technique of improving the stability with temperature by employing a substrate having a silicon oxide ($SiO_2$) film formed on the surface of a LN substrate or an LT substrate. The silicon oxide film has the opposite temperature coefficient to that of the LN or LT substrate. Japanese Patent Publication No. 2516817 (hereinafter referred to as Patent Document 1) also discloses a technique of improving the stability with temperature by forming a polarity inversion layer with a thickness equivalent to the wavelength of SAW or smaller on the surface of an LT substrate. In this technique, a field short-circuiting effect is utilized to improve the stability with temperature. Japanese Unexamined Patent Publication No. 11-55070 (hereinafter referred to as Patent Document 2) and Ohnishi, et al., Proc. of IEEE Ultrasonics Symposium, pp. 335–338, 1998 (hereinafter referred to as Non-Patent Document 2), also disclose techniques of improving the stability with temperature by directly joining a thin piezoelectric substrate to a thick low expansion material substrate. In these techniques, expansion and contraction of the piezoelectric material with temperature changes are restricted to improve the stability with temperature. Yamanouchi, et al., Proc. of IEEE Ultrasonics Symposium, pp. 239–242, 1999 (hereinafter referred to as Non-Patent Document 3) further discloses a technique of improving the stability with temperature by joining a thin piezoelectric substrate to a thick low expansion material substrate with an adhesive agent or the like. In this technique, expansion and contraction of the piezoelectric substrate are also restricted to improve the stability with temperature. Japanese Unexamined Patent Publication No. 9-208399 (hereinafter referred to as Patent Document 3) discloses a technique of improving the SAW characteristics by joining two substrates of different kinds to each other by virtue of solid-phase reaction.

FIGS. 1A and 1B illustrate a conventional SAW device chip 100 that is formed with one of the joined substrates described above. As shown in FIG. 1A, four resonators (four one-port resonators) 10 are formed on one chip, and each two neighboring resonators 10 (A and B, C and D in FIG. 1A) form a filter. The SAW device chip 1 is of a duplexer type. In the conventional SAW device chip 100, comb-like electrodes (interdigital transducers: IDTs) 11 and reflection electrodes 12 that constitute the resonators 10 are formed on the upper surface of a piezoelectric substrate 20. In each resonator 10, one IDT 11 is sandwiched between two reflection electrodes 12. A supporting substrate is joined to the bottom surface of the piezoelectric substrate. Each two resonators 10 forming one filter are normally arranged not to overlap each other in the SAW propagating direction. So as to reduce the chip size, however, any two neighboring resonators 10 of different filters may be arranged to overlap each other in the SAW propagating direction.

In a case where a joined substrate is employed in a conventional SAW device, however, the joining interface between the piezoelectric substrate and the supporting substrate may be separated in two when the individual SAW device is cut out of a multiple substrate.

Japanese Unexamined Patent Publication No. 2001-60846 (hereinafter referred to as Patent Document 4) discloses a technique of solving the above problem by dicing the piezoelectric substrate and the supporting substrate with two different dicing saws. Referring now to FIGS. 2A through 2C, this conventional technique will be described in detail. In this technique, a joined substrate (a base substrate) is first formed with the piezoelectric substrate 20 having the IDTs 11 and the other components formed thereon and the supporting substrate 30, as shown in FIG. 2A.

When the base substrate is to be divided into individual SAW device chips 100, grooves 81 are formed by cutting (removing) the piezoelectric substrate 20 along the boundary lines of the individual SAW device chips 100, as shown in FIG. 2B, using a dicing blade. The supporting substrate 30 is then cut along the bottoms of the grooves and the boundary lines of the individual SAW device chips 100, as shown in FIG. 2C. The dicing blade used in this procedure is thinner than the dicing blade used in the procedure of FIG. 2B, or is thinner than the grooves 81. In this manner, the individual SAW device chips 100 can be obtained.

In a SAW device chip that has a supporting substrate with a smaller thermal expansion coefficient than that of the piezoelectric substrate so as to improve the stability with temperature, however, the piezoelectric substrate is made so thin as to restrict thermal expansion of the piezoelectric substrate by virtue of stress caused between the substrates. Because of this, most bulk waves that are generated from the IDTs formed on the piezoelectric substrate and are propagated in the depth direction are reflected by the joining interface. The degree of reflection is even greater in a case of a joined substrate formed by directly joining two substrates, because the joining strength between the directly joined substrates is high, and the joined interface is a mirror surface.

The reflected bulk waves do not cause a problem where the resonators arranged to overlap each other in the SAW propagating direction are at a sufficient distance from each other. In a small-sized SAW device chip that is often seen today, however, the distance between each two neighboring resonators in the SAW propagating direction is too short to prevent the reflected bulk waves from entering the neighboring resonators in the SAW propagating direction. As a result, spurious waves are generated, and the filter characteristics deteriorate.

SUMMARY OF THE INVENTION

It is therefore an object of the present invention to provide a surface acoustic wave device and a method of manufacturing the surface acoustic wave device in which the above disadvantage is eliminated.

A more specific object of the present invention is to provide a surface acoustic wave device that can exhibit excellent filter characteristics and a method of manufacturing the surface acoustic wave device.

These objects of the present invention are achieved by a surface acoustic wave device comprising: a piezoelectric substrate that has two or more resonators formed on a surface; and a supporting substrate that is joined to another surface of the piezoelectric substrate, at least two of the resonators having exciting portions that overlap each other in the direction of propagating surface acoustic waves, and at least a part of the piezoelectric substrate being removed or modified to have different properties between at least one pair of overlapping resonators among the resonators having the overlapping portions.

The objects of the present invention are also achieved by a surface acoustic wave device comprising: a piezoelectric substrate that has two or more resonators formed on a surface; and a supporting substrate that is joined to another surface of the piezoelectric substrate, all of the resonators having exciting portions that do not overlap each other in the direction of propagating surface acoustic waves, and at least a part of the piezoelectric substrate being removed or modified to have different properties between at least one pair of resonators among the resonators.

The objects of the present invention are also achieved by a method of manufacturing a surface acoustic wave device that includes a piezoelectric substrate that has two or more resonators formed on a surface, and a supporting substrate that is joined to another surface of the piezoelectric substrate, the method comprising the step of removing or modifying at least a part of the piezoelectric substrate between at least one pair of overlapping resonators among the resonators having resonant portions that overlap each other in the direction of propagating surface acoustic waves.

The objects of the present invention are achieved by a method of manufacturing a surface acoustic wave device that includes a piezoelectric substrate that has two or more resonators formed on a surface, and a supporting substrate that is joined to another surface of the piezoelectric substrate, the method comprising the step of removing or modifying at least a part of the piezoelectric substrate between at least one pair of resonators among the resonators having resonant portions that do not overlap each other in the direction of propagating surface acoustic waves.

The objects of the present invention are also achieved by a method of manufacturing a surface acoustic wave device that includes a piezoelectric substrate of a multiple structure that has two or more resonators formed on a surface, and a supporting substrate that is joined to another surface of the piezoelectric substrate, the method comprising the steps of: removing at least a part of the piezoelectric substrate along a dicing line that defines the surface acoustic wave device; and separating the surface acoustic wave device from others by cutting along the dicing line with a laser beam or a scriber.

The objects of the present invention are also achieved by a method of manufacturing a surface acoustic wave device that includes a piezoelectric substrate of a multiple structure that has two or more resonators formed on a surface, and a supporting substrate that is joined to another surface of the piezoelectric substrate, the method comprising the steps of: modifying at least a region including a joining interface between the piezoelectric substrate and the supporting substrate on the dicing line that defines the surface acoustic wave device; and separating the surface acoustic wave device from others along the dicing line by heating the piezoelectric substrate and/or the supporting substrate.

BRIEF DESCRIPTION OF THE DRAWINGS

Other objects, features and advantages of the present invention will become more apparent from the following detailed description when read in conjunction with the accompanying drawings, in which:

FIGS. 6A through 6G illustrate production procedures in a method of manufacturing SAW device chips in accordance with the first embodiment of the present invention;

DESCRIPTION OF THE PREFERRED EMBODIMENTS

The following is a description of embodiments of the present invention, with reference to the accompanying drawings.

(First Embodiment)

Figure 1A:
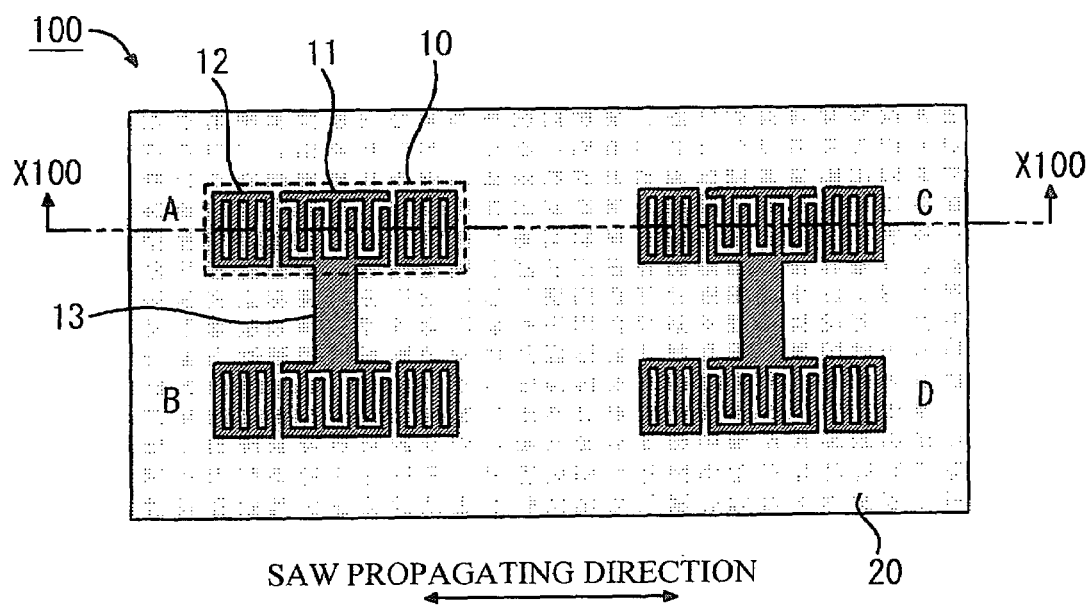
FIG. 1A is a top view of a conventional SAW device chip.
Figure 1B:
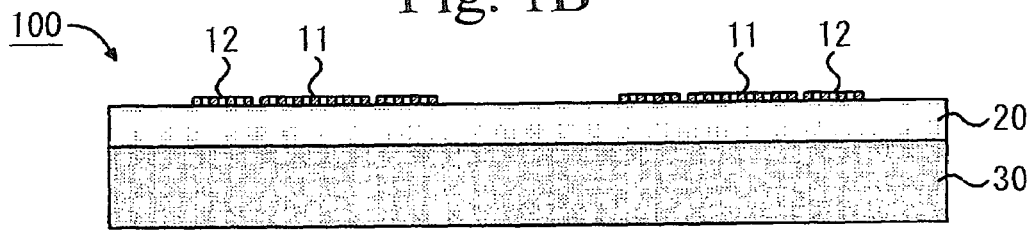
FIG. 1B is a section view of the conventional SAW device chip, taken along the line X100—X100 of FIG. 1A.
Figure 2A:
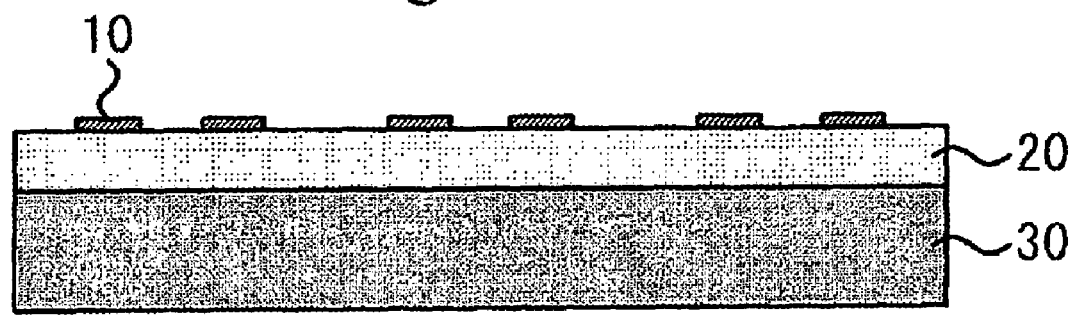
FIGS. 2A through 2C illustrate procedures of a conventional method of manufacturing the SAW device chip shown in FIGS. 1A and 1B.
Figure 2B:
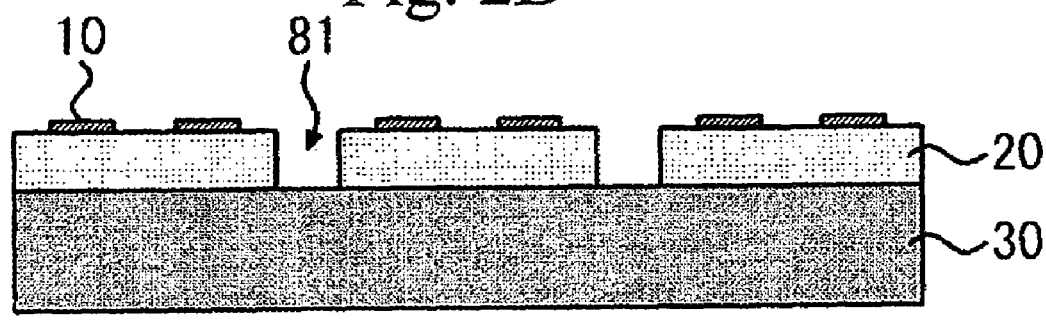
Figure 2C:
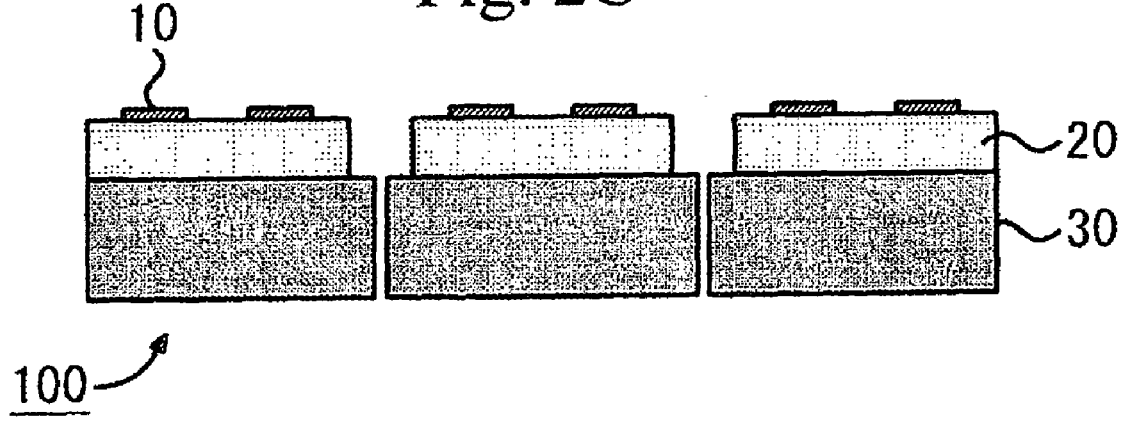
Figure 3A:
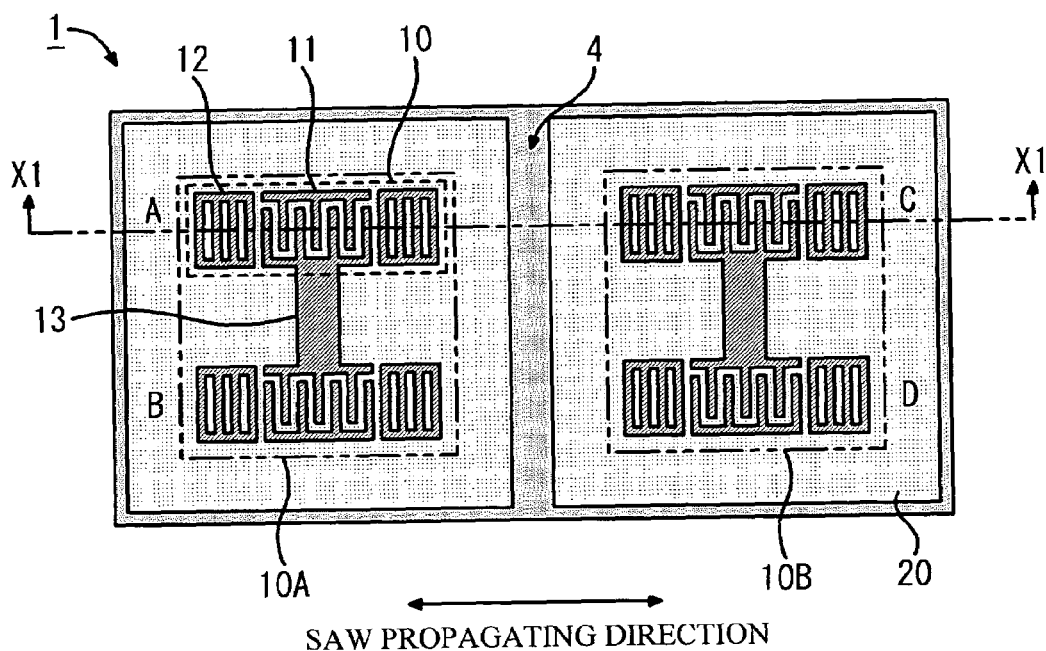
FIG. 3A is a top view of a SAW device chip in accordance with a first embodiment of the present invention.
Figure 3B:
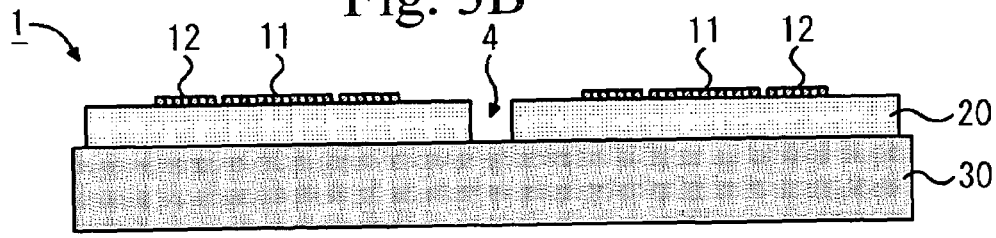
FIG. 3B is a section view of the SAW device chip, taken along the line X1—X1 of FIG. 3A.

A first embodiment of the present invention will be first described in detail. FIGS. 3A and 3B illustrate the structure of a surface acoustic wave (SAW) device chip 1 in accordance with this embodiment. FIG. 3A is a top view of the SAW device chip 1. FIG. 3B is a section view of the SAW device chip 1, taken along the line X1—X1 of FIG. 3A.

As shown in FIGS. 3A and 3B, the SAW device chip 1 has a supporting substrate 30 joined to a second surface (which is the bottom surface) of a piezoelectric substrate 20, and also has resonators 10 formed on a first surface (which is the upper surface) of the piezoelectric substrate 20. Each of the resonators 10 includes comb-like electrodes (IDTs) 11 and reflection electrodes 12.

The piezoelectric substrate 20 is a piezoelectric single-crystal substrate of 42-degree Y-cut X-propagation lithium tantalate (hereinafter referred to as the "LT substrate"). In the LT substrate, the linear expansion coefficient in the SAW propagating direction X is 16.1 ppm/degree C. It is also possible to employ a piezoelectric single-crystal substrate of 64-degree Y-cut X-propagation lithium niobate ($LiNbO_3$) (hereinafter referred to as the "LN substrate"), or a substrate made of a piezoelectric material such as crystal. In the LN substrate, the linear expansion coefficient in the SAW propagating direction X is 15.4 ppm/degree C. The 42-degree Y-cut X-propagation LT substrate utilizes leaky surface waves. Substrates that utilize leaky surface waves include a LST-cut crystal substrate and a 128-degree Y-cut X-propagation LN substrate. It is also possible to employ one of those substrates.

The supporting substrate 30 is a R-plane cut sapphire substrate or a silicon substrate that has a smaller linear expansion coefficient than the piezoelectric substrate 20 (a LT substrate, a LN substrate, or the like and a high Young's modulus). In the R-plane cut sapphire substrate, the linear expansion coefficient in the SAW propagating direction X is 5.3 ppm/degree C. In the following description, the R-plane cut sapphire substrate (hereinafter referred to as the "sapphire substrate") will be employed, and the thickness of the sapphire substrate is 300 μm.

In this embodiment, the piezoelectric substrate 20 and the supporting substrate 30 are joined by a substrate joining method utilizing surface activation between the joining surfaces, for example. Through the substrate joining method utilizing surface activation, the joining strength between the substrates 20 and 30 is increased, and the temperature stability of the SAW device chip 1 is increased by the supporting substrate 30. Also, the piezoelectric substrate 20 and the supporting substrate 30 may be joined to each other with resin or some other adhesive material.

Figure 4A:
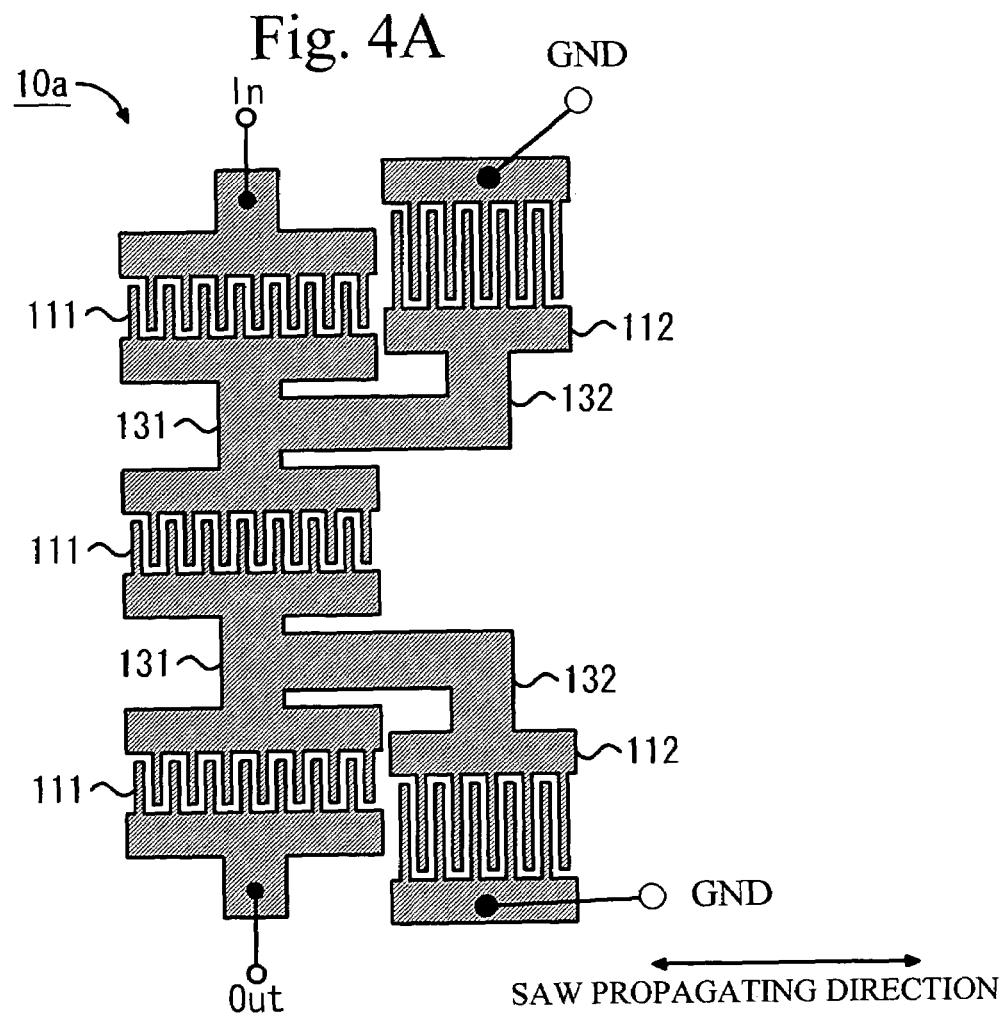
FIG. 4A is a top view of a ladder filter to be employed in the present invention.
Figure 4B:
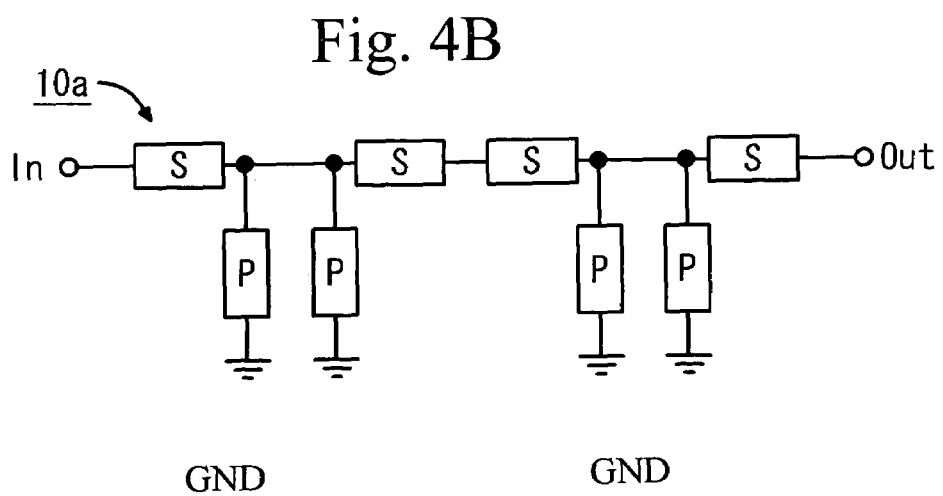
FIG. 4B is a circuit diagram of the ladder filter shown in FIG. 4A.

In FIGS. 3A and 3B, each of the resonators 10 formed on the upper surface of the piezoelectric substrate 20 is a one-port resonator. Among the four resonators 10, each two resonators are connected with a wiring pattern 13, so as to form two pairs of 1.9 GHz band filters. Here, the SAW wavelength is 2.1 μm. The SAW device chip 1 shown in FIGS. 3A and 3B is structured as a 1.9 GHz band duplexer. In a case where each filter is a ladder filter 10a having a multi-stage structure (a four-stage structure, for example), the structure of the ladder filter 10a includes series-arm resonators S having IDTs 111 connected in series arms 131, and parallel-arm resonators P having IDTs 112 connected in parallel arms 132, as shown in FIG. 4A. FIG. 4B is a circuit diagram of the four-stage ladder filter 10a shown in FIG. 4A. For ease of explanation, the following description concerns a duplexer that includes four one-port resonators A, B, C, and D, which are shown in FIG. 3A. In this duplexer, the resonators A and B form a transmission filter, and the resonators C and D form a reception filter.

The structure shown in FIG. 3A is designed so that each two resonators (A and B, C and D) forming a filter do not overlap each other in the SAW propagating direction. However, each two filters (A and C, B and D) not forming the same filter overlap each other in the SAW propagating direction. In this structure, a bulk wave that is reflected by the joining interface between the piezoelectric substrate 20 and the supporting substrate 30 enters the resonators that overlap each other in the SAW propagating direction (C/A in a case of A/C, or D/B in a case of B/D), resulting in a spurious wave. This causes a serious problem when a sufficient distance cannot be secured between the resonators during the production process of a small-sized chip.

Figure 5:
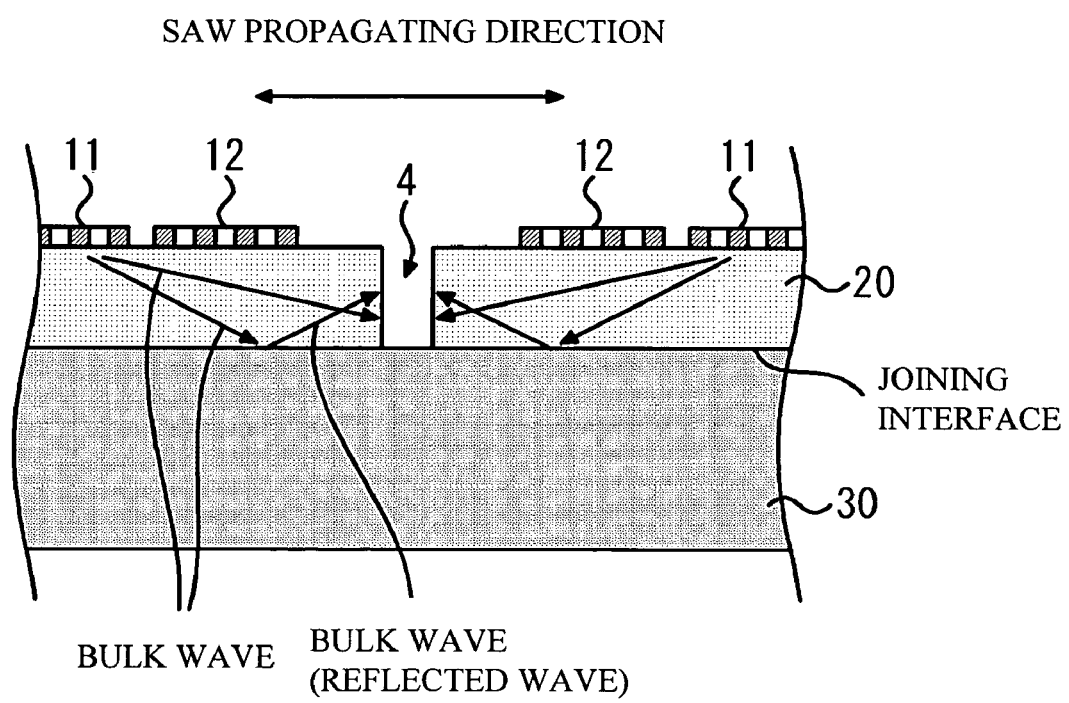
FIG. 5 illustrates bulk wave propagation in the SAW device chip in accordance with the first embodiment of the present invention.

So as to avoid such a problem, as shown in FIGS. 3A and 3B, the piezoelectric substrate 20 is partially removed to form a groove 4 between each two neighboring resonators 10 that are located next to each other in the SAW propagating direction (i.e., between the resonators A and C and between the resonators B and D). Thus, the resonators 10 that overlap each other in the SAW propagating direction are physically isolated from each other. Accordingly, the bulk wave (including the wave reflected by the joining interface) that is generated from a resonator 10 and is propagated through the piezoelectric substrate 20 can be prevented from entering the other resonator 10, as shown in FIG. 5. Thus, the generation of a spurious wave can be avoided. As will be described later, the groove 4 is formed by cutting the piezoelectric substrate 20 with a dicing blade or the like, and because of that, the side surfaces (the cut surfaces of the piezoelectric substrate 20) are rough. A bulk wave that impinges on a side surface of the groove 4 is diffusely reflected, and therefore, does not cause a spurious wave. As will also be described later, propagation of a bulk wave can be prevented by forming cracks through laser irradiation. Such cracks should be very narrow grooves that can physically cut or separate the piezoelectric substrate 20.

A method of manufacturing the SAW device chip 1 in accordance with this embodiment will now be described in detail, with reference to the accompanying drawings.

FIGS. 6A through 6G illustrate the process of producing the SAW device chip 1. So as to achieve a higher productivity and to reduce the production cost of each one chip, a multiple structure is employed in this embodiment.

In this method, a piezoelectric substrate 20A that is thicker than the piezoelectric substrate 20 in the form of a product is first joined to the supporting substrate 30 to form the joined substrate, as shown in FIG. 6A. At this point, surface activation treatment utilizing ion beams, neutralized beams, or plasma of an inert gas such as argon (Ar) or oxygen should preferably be carried out on the joining surfaces of the substrates 20A and 30. Through the activation treatment, the joining strength between the substrates 20A and 30 can be increased. The joining strength can be further increased by pressing the substrates 20A and 30 to each other at a temperature of 100 degrees C. or lower when the substrates 20A and 30 are joined to each other. Through the substrate joining procedure involving surface activation, annealing at a temperature as high as 1000 degrees C. or higher becomes unnecessary after the substrates 20A and 30 are joined to each other. Accordingly, the substrates 20A and 30 are not damaged, and substrates of various types can be employed for the joined substrate.

In the next procedure, at least the piezoelectric substrate 20A of the joined substrate is ground and polished to a suitable thickness as a product, as shown in FIG. 6B. However, this procedure can be omitted if the piezoelectric substrate 20 that has such a thickness is employed in the procedure of FIG. 6A. As for the supporting substrate 30, grinding and polishing should be performed in this procedure, if a thicker substrate than a supporting substrate in the form of a product is employed as the supporting substrate 30. After this procedure, the joining strength can be further increased by performing annealing at a temperature of 200 degrees C. or lower. Through the annealing performed after the grinding and polishing procedure, generation of thermal stress can be reduced to the smallest possible amount, and thus, the substrates are not damaged.

After the joined substrate of the piezoelectric substrate 20 and the supporting substrate 30 is produced, a metal film 11A is formed on the upper surface of the piezoelectric substrate 20, and a mask 11a is formed thereon by a photolithographic technique, as shown in FIG. 6D. Etching is then performed on the mask 11a to produce a multiple base substrate having the IDTs 11, the reflection electrodes 12, and the wiring patterns 13 (including electrode pads for inputting and outputting signals: see FIGS. 3A and 3B) that are two-dimensionally arranged, as shown in FIG. 6E.

The production process then moves on to the procedure of dicing the base substrate into individual SAW device chips 1. In this procedure, the piezoelectric substrate 20 is diced by a different dicing technique from the dicing technique for dicing the supporting substrate 30. In a case where the supporting substrate 30 is made of a material that is harder than a piezoelectric substrate made of sapphire or silicon, however, the surfaces that form the joining interface in the vicinity of the dicing areas easily separate from each other. Also, controlling the dicing speed requires high sensitivity. Therefore, the production efficiency decreases, and mass production becomes difficult, as already mentioned as the problems with Patent Document 4. There are other problems that the blade used for the dicing wears out quickly, and that the life of the manufacturing apparatus becomes shorter. In this embodiment that employs the supporting substrate 30 (a sapphire substrate), which is harder than the piezoelectric substrate 20, a laser beam is used for dicing the supporting substrate 30, instead of a dicing blade, so as to avoid the above mentioned problems. As a laser beam puts a smaller load onto the dicing areas than a dicing blade does, controlling the dicing speed becomes easier, and the above mentioned problems can be eliminated. More specifically, separation of the joining interface in the vicinity of the dicing areas can be prevented, and a decrease of the life of a dicing blade can be avoided. Thus, SAW device chips can be mass produced with high efficiency and high yield. In the following, this procedure will be described in detail, with reference to FIG. 6E.

As shown in FIG. 6F, the boundary areas (the dicing lines) of the individual SAW device chips 1 are first cut out (removed) from the piezoelectric substrate 20 with a dicing blade, so as to form grooves 81. In this procedure, the overlapping areas (the grooves 4: see FIGS. 3A and 3B) between the IDTs 11 in the SAW propagating direction are also cut out (removed) from the piezoelectric substrate 20. Accordingly, the dicing areas (the dicing lines) of the SAW device chips 1 and the separating areas between the resonators 10 in the SAW propagating direction are removed in the same procedure in accordance with this embodiment. By doing so, SAW device chips 1 that do not cause spurious waves from bulk waves can be produced, without an increase of the number of production procedures. In this procedure, a diamond blade of 200 µm in width and #2000 in granularity is used to form the grooves 4 and 81 of the same widths, with the stage on which the base substrate is mounted being moved at a speed of 5 mm per second. However, any type of dicing blade may be used in this procedure, as long as the dicing blade has a width of 40 μm to 200 μm so as to form the grooves 4 each having a width of 40 μm to 200 μm. Also, it is possible to make the grooves 4 narrower than the grooves 81 formed in the boundary areas (along the dicing lines) of the SAW device chips 1. Therefore, a thin dicing blade having a width of 40 μm or smaller may be used for forming the grooves 4. Although a diamond dicing blade has been taken as an example, a resin blade may also be used for cutting the piezoelectric substrate 20. A resin blade can cut the piezoelectric substrate 20, without damaging the supporting substrate 30 or reducing the strength of the supporting substrate 30.

In this production process, a laser beam that is narrower than each of the grooves 81 is then used for cutting the supporting substrate 30 that is now exposed through the above described procedures. The cutting is performed along the boundary lines of the individual SAW device chips 1, as shown in FIG. 6G. Through this procedure, separation of the joining interface can be prevented in the vicinity of the dicing lines, and the individual SAW device chips 1 can be obtained with efficiency.

Figure 7A:
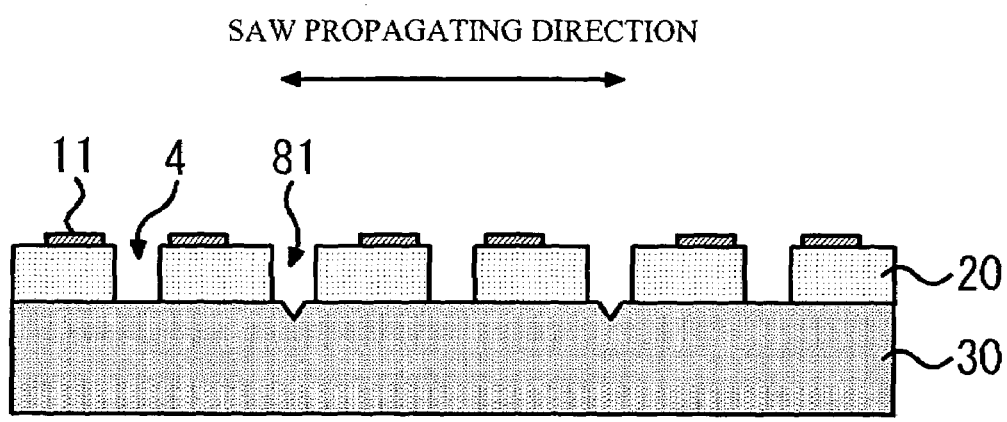
FIGS. 7A and 7B illustrate production procedures in another method of manufacturing SAW device chips in accordance with the first embodiment of the present invention.
Figure 7B:
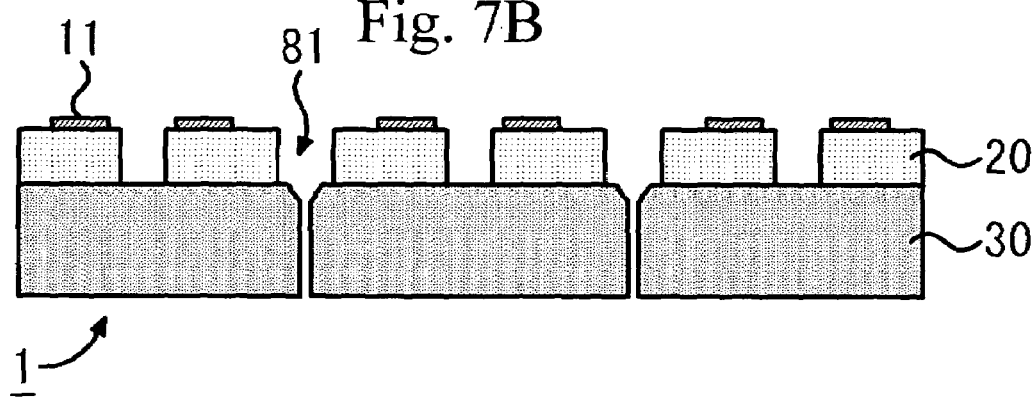

Although a laser beam is used for dicing the supporting substrate 30 to obtain the individual SAW device chips 1 in the procedure of FIG. 6G, it is also possible to employ a scriber to create scratches 82 on the now exposed supporting substrate 30 along the boundary lines (the dicing lines) of the individual SAW device chips 1, as shown in FIG. 7A. A breaker is then used to divide the supporting substrate 30 along the scratches 82 formed with the scriber. Thus, the individual SAW device chips 1 are obtained. In this procedure, a diamond needle having a top edge that is narrower than each groove 81 is employed for the scriber. If a dicing blade of 200 μm in width is used, the top edge of the diamond needle is 150 μm, for example.

Figure 8A:
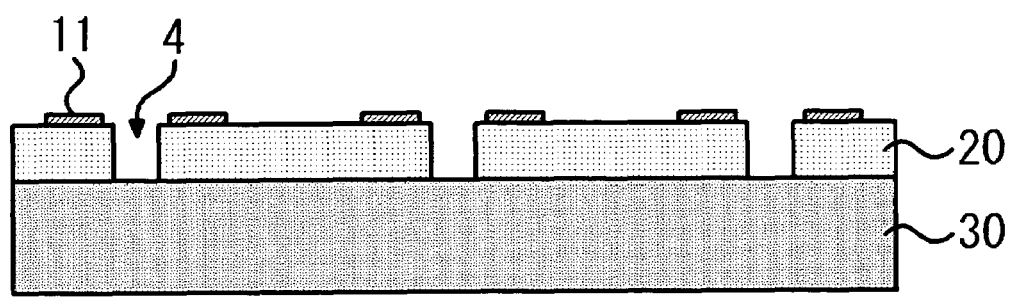
FIGS. 8A through 8C illustrate production procedures in yet another method of manufacturing SAW device chips in accordance with the first embodiment of the present invention.
Figure 8B:
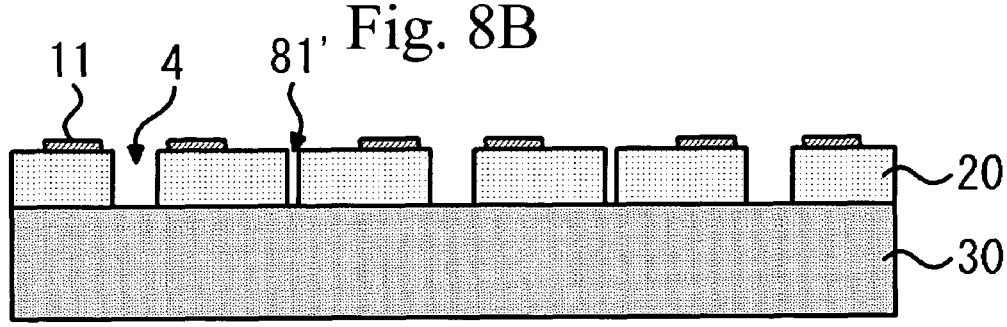
Figure 8C:
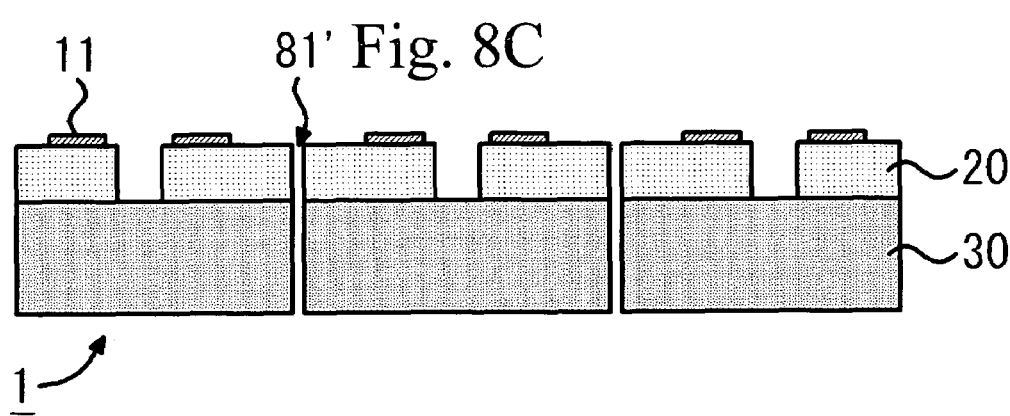

In the procedures of dicing the piezoelectric substrate 20 and the supporting substrate 30, a YAG laser that has a relatively large output and excellent laser characteristics may be used to melt (or ablate) the substrates 20 and 30. More specifically, after the IDTs 11 and the other components are formed on the joined substrate through the procedures of FIGS. 6A through 6D, a laser beam is used to melt (or ablate) the piezoelectric substrate 20 to form grooves 81', as shown in FIG. 8B. Likewise, a laser beam is used to melt (or ablate) and divide the supporting substrate 30, as shown in FIG. 8C. In a case of employing such a technique, the grooves 4 should be formed with a dicing blade in a procedure prior to the melting of the piezoelectric substrate 20, as shown in FIG. 8A.

Although the technique of melting the piezoelectric substrate 20 and the supporting substrate 30 has been described above, it is also possible to utilize a technique of forming a property-modified layer through multi-photon absorption and then applying external force to the modifying layer to dice the piezoelectric substrate 20 and the supporting substrate 30. Production procedures involving such a technique will now be described in detail, with reference to FIGS. 9A through 9C.

Figure 9A:
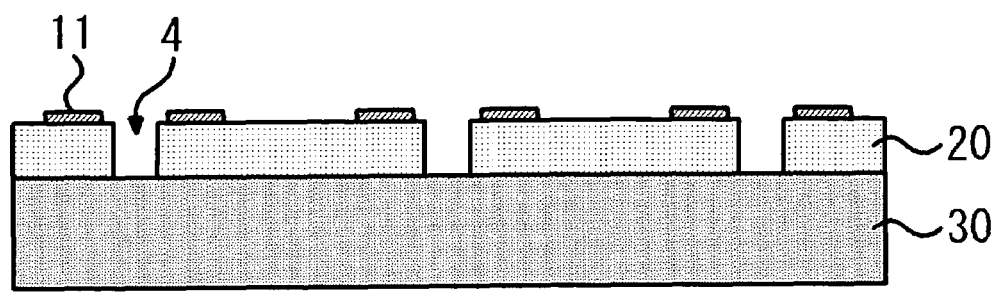
FIGS. 9A through 9C illustrate production procedures in still another method of manufacturing SAW device chips in accordance with the first embodiment of the present invention.
Figure 9B:
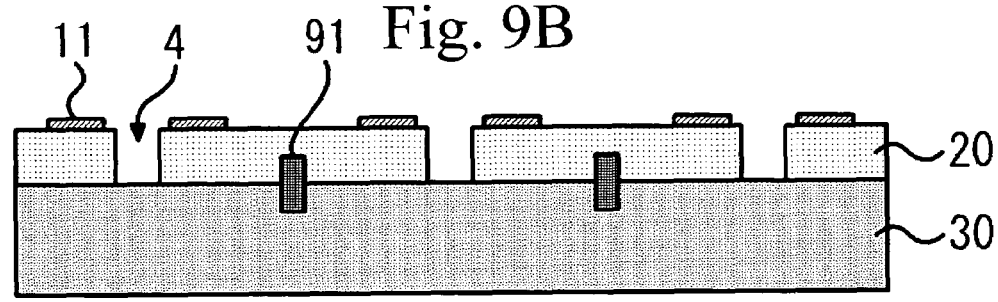
Figure 9C:
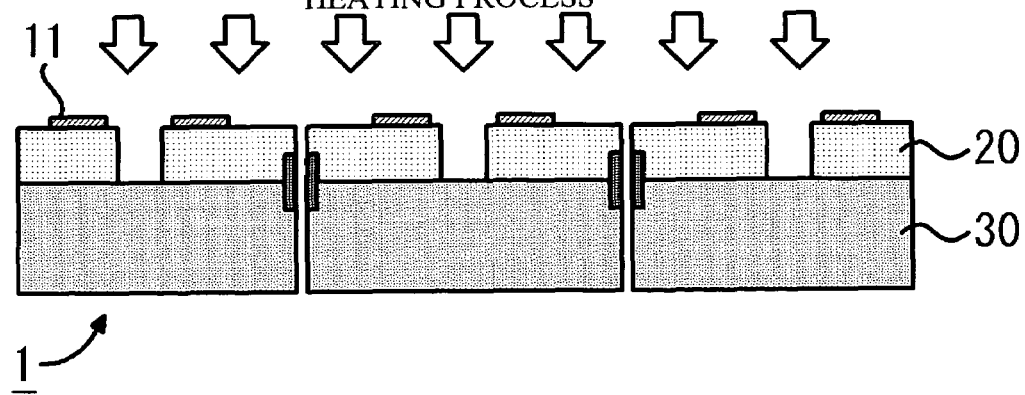

After the IDTs 11 and the other components are formed on the joined substrate through the procedures of FIGS. 6A through 6D, the grooves 4 are formed with a dicing blade or the like, as shown in FIG. 9A. A laser beam is then emitted onto a region including the joining interface in the dicing areas (the dicing lines) that separate the individual SAW device chips 1 from one another. As a result, regions having the properties modified through the melting or the multi-photon absorption (modified portions 91) are formed, as shown in FIG. 9B. Here, each of the modified portions 91 vertically extends from the joining interface by approximately 10 μm (on the side of the piezoelectric substrate 20 and the side of the supporting substrate 30). The base substrate thus obtained is then heated to cause thermal stress at the joining interface by virtue of the thermal expansion coefficient difference between the piezoelectric substrate 20 and the supporting substrate 30. With the thermal stress, the base substrate is divided into the individual SAW device chips 1, as shown in FIG. 9C.

Figure 10:
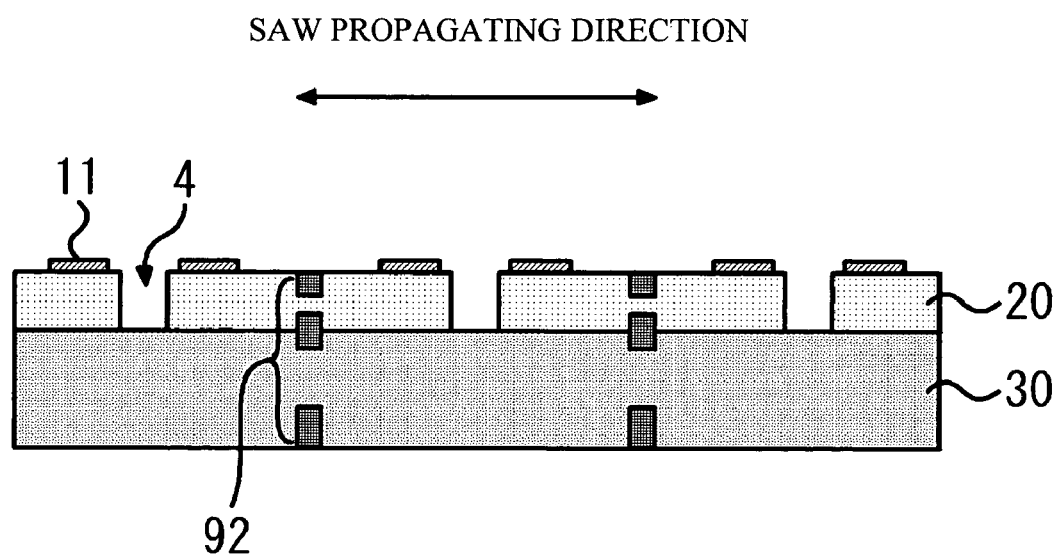
FIG. 10 illustrates a production procedure in yet another method of manufacturing SAW device chips in accordance with the first embodiment of the present invention.

Also, the portions on which the property modifying process is carried out are not limited to the joined substrate of the piezoelectric substrate 20 and the supporting substrate 30. As shown in FIG. 10, modified portions 92 each having a depth of approximately 10 μm may be formed in the vicinity of the surface (on the opposite side from the supporting substrate 30) of the piezoelectric substrate 20, and modified portions 92 each having a depth of approximately 100 μm may also be formed in the vicinity of the surface (on the opposite side from the piezoelectric substrate 20) of the supporting substrate 30. With this structure, the base substrate can be diced with certainty and high yield.

Since the portions in the vicinity of the joining interface are subjected to the property modifying treatment, as shown in FIGS. 9A and 10, it is easy to cut the base substrate at the modified portions. Accordingly, it is possible to dice the joined substrate with a dicing blade, a laser beam, or a scriber, instead of a heating treatment. Thus, the SAW device chips 1 can be obtained, without causing separation of the piezoelectric substrate 20 and the supporting substrate 30.

Figure 11:
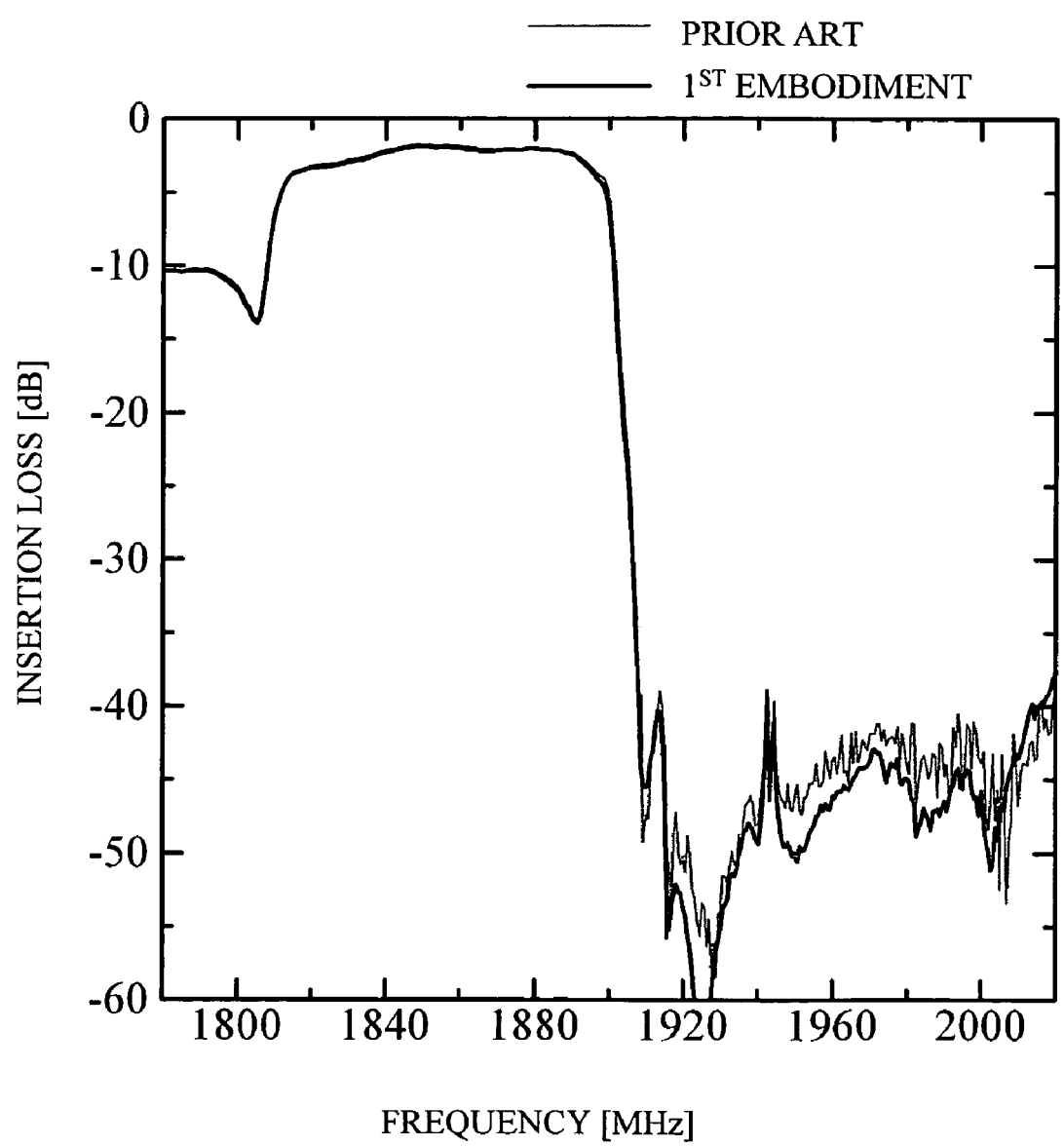
FIG. 11 is a graph showing the filter characteristics of SAW device chips in accordance with the first embodiment of the present invention.

Referring now to FIG. 11, the filter characteristics of the SAW device chips 1 produced as above will be described in detail. FIG. 11 shows the filter characteristics of a SAW device chip 1 that is produced as a 1.9 GHz band duplexer. The SAW device chip 1 has a 30 μm thick piezoelectric substrate 2 (an LT substrate) and a 300 μm thick supporting substrate 3 (a sapphire substrate).

If the SAW device chip 1 is influenced by bulk waves, spurious peaks appear on the high frequency side of the filter characteristics, and the degree of suppression drops in the band area of the reception filter that is normally used as a reception band. However, the structure in accordance with this embodiment dramatically reduces spurious peaks, and excellent filter characteristics are obtained, as shown in FIG. 11.

As described above, it is possible to substantially physically separate the resonators 10 that have overlapping areas in the SAW propagating direction from each other in accordance with this embodiment. Accordingly, bulk waves cannot enter the overlapping areas among the resonators 10, and generation of spurious waves is prevented. Thus, excellent filter characteristics can be obtained. Also, this embodiment employs a two-stage substrate dicing procedure, and a laser beam is used to dice the supporting substrate. Even if the supporting substrate is made of a harder material than the piezoelectric substrate, the dicing speed can be easily controlled, and separation of the joining interface in the vicinity of the dicing areas and a decrease of the life of a dicing blade can be prevented. Thus, SAW device chips can be efficiently mass produced with high yield.

(Second Embodiment)

Figure 12A:
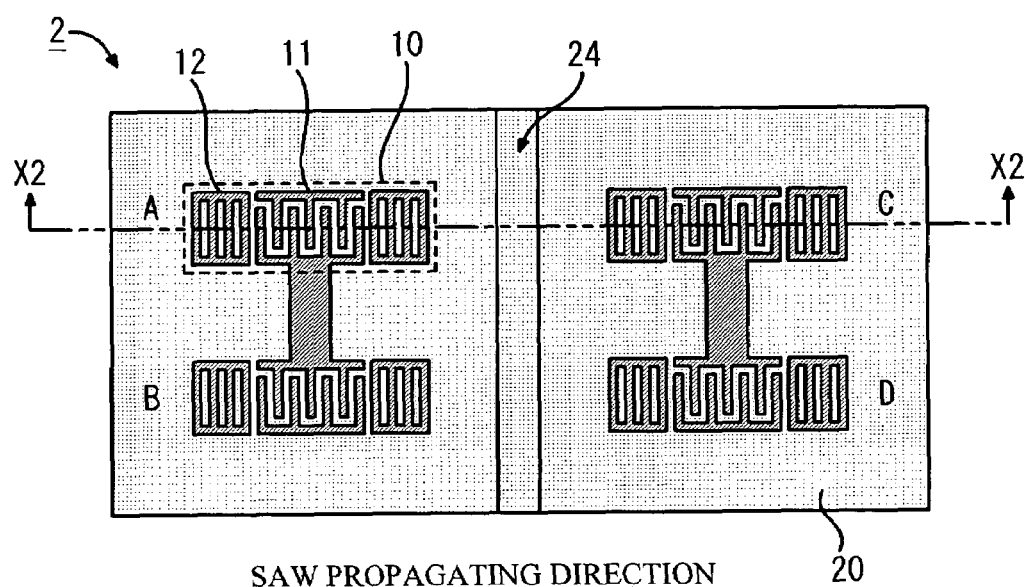
FIG. 12A is a top view of a SAW device chip in accordance with a second embodiment of the present invention.
Figure 12B:
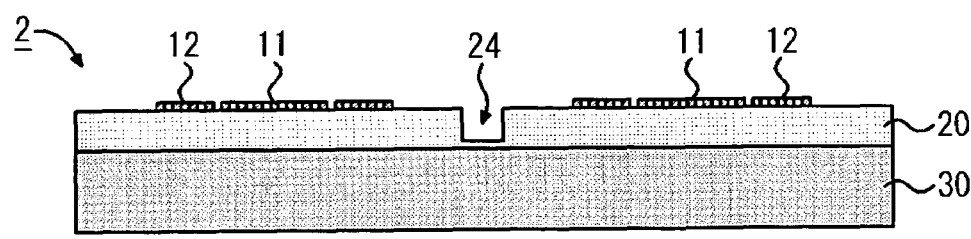
FIG. 12B is a section view of the SAW device chip, taken along the line X2—X2 of FIG. 12A.

Next, a second embodiment of the present invention will be described in detail, with reference to the accompanying drawings. FIGS. 12A and 12B illustrate a SAW device chip 2 in accordance with this embodiment. FIG. 12A is a top view of the SAW device chip 2, and FIG. 12B is a section view of the SAW device chip 2, taken along the line X2—X2 of FIG. 12A.

As shown in FIGS. 12A and 12B, the SAW device chip 2 has grooves 24 formed between each two neighboring resonators 10 (between the resonators A and C, and between the resonators B and D) that overlap each other in the SAW propagating direction. The SAW device chip 2 has the same structure as the SAW device chip 1 of the first embodiment shown in FIGS. 3A and 3B, except that the grooves 24 do not completely cut the piezoelectric substrate 20. In this embodiment, the grooves 24 are formed, with the piezoelectric substrate 20 remaining at the bottom of each groove 24 by a thickness of several micronmeters (5 μm, for example).

Such a structure is effective especially in a case where the supporting substrate 30 is made of a material (such as glass) that is softer than the piezoelectric substrate 20. With this structure, the supporting substrate 30 cannot be damaged at the time of dicing the piezoelectric substrate 20. Even in a case where the supporting substrate 30 is made of a material (such as sapphire or silicon) that is harder than the piezoelectric substrate 20, the structure of this embodiment can reduce the chance that the supporting substrate 30 is damaged. With the piezoelectric substrate 20 remaining in the thickness direction by a thickness of several micronmeters, bulk waves cannot be propagated from a resonator 10 to the other resonator 10, and generation of spurious waves can be restricted.

A method of manufacturing SAW device chips 2 in accordance with this embodiment will now be described in detail, with reference to the accompanying drawings.

Figure 13A:
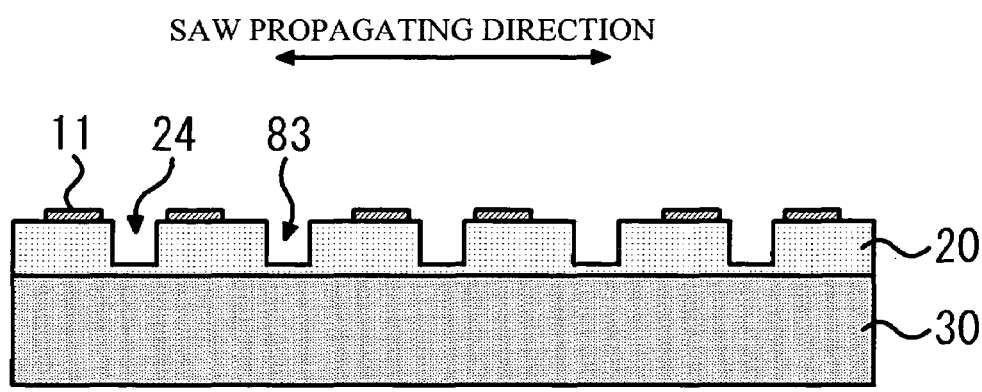
FIGS. 13A and 13B illustrate production procedures in a method of manufacturing SAW device chips in accordance with the second embodiment of the present invention.
Figure 13B:
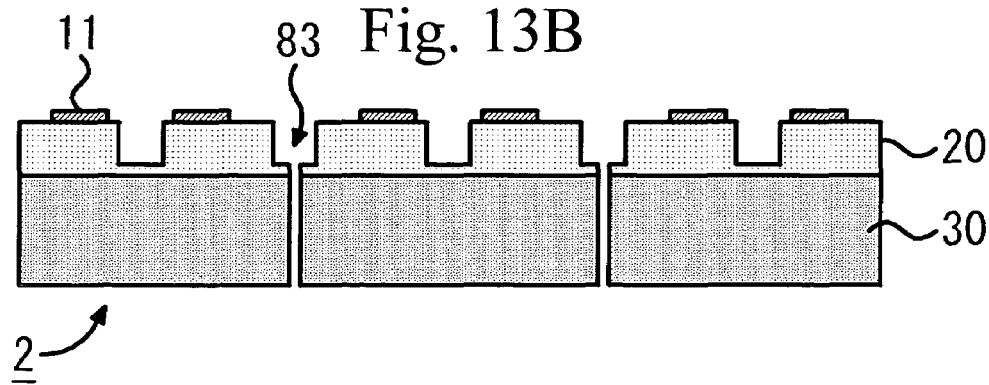

FIGS. 13A and 13B illustrate production procedures in the method of manufacturing the SAW device chips 2. Like the manufacturing method in accordance with the first embodiment, this method also involves a multiple structure, so as to increase the productivity and to reduce the production cost of each one chip.

In this manufacturing method, a joined substrate (a base substrate) that includes the piezoelectric substrate 20 having the IDTs 11 and other components formed thereon and the supporting substrate 30 is first produced through the same procedures as those of FIGS. 6A through 6D.

So as to divide the base substrate into individual SAW device chips 2, a dicing blade is used to cut (remove) the piezoelectric substrate 20 along the boundary lines (the dicing lines) of the individual SAW device chips 2, without penetrating the piezoelectric substrate 20, as shown in FIG. 13A. Here, the piezoelectric substrate 20 remains on the boundary lines by a thickness of approximately 5 μm. In this procedure, the grooves 24 are also formed by cutting (removing) the piezoelectric substrate 20 along the regions between the IDTs 11 overlapping in the SAW propagating direction, without penetrating the piezoelectric substrate 20 (having a thickness of approximately 5 μm remaining on the supporting substrate 30). Accordingly, SAW device chips 2 that restrict generation of spurious waves from bulk waves can be produced, without an increase of the number of production procedures. In this embodiment, a diamond blade of 100 μm in width and #2000 in granularity is used to form the grooves 24 and 83 of the same widths, while the stage on which the base substrate is mounted is moved at a speed of 5 mm per second. However, any type of dicing blade may be employed, as long as the dicing blade has a width of 40 μm to 200 μm so as to form the grooves 24 each having a width of 40 μm to 200 μm. The grooves 24 may be narrower than the grooves 83 formed on the boundary lines among the SAW device chips 2. Therefore, a thin dicing blade having a width of 40 μm or smaller may be employed to form the grooves 24.

Figure 14A:
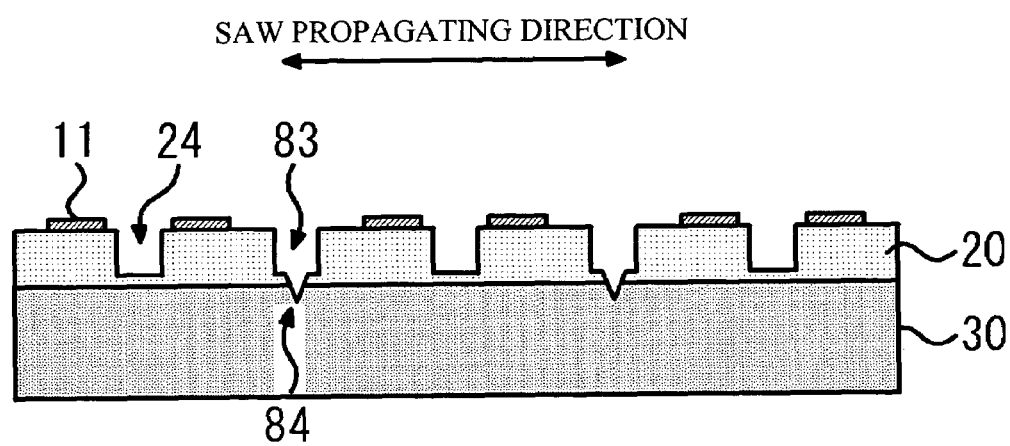
FIGS. 14A and 14B illustrate production procedures in another method of manufacturing SAW device chips in accordance with the second embodiment of the present invention.
Figure 14B:
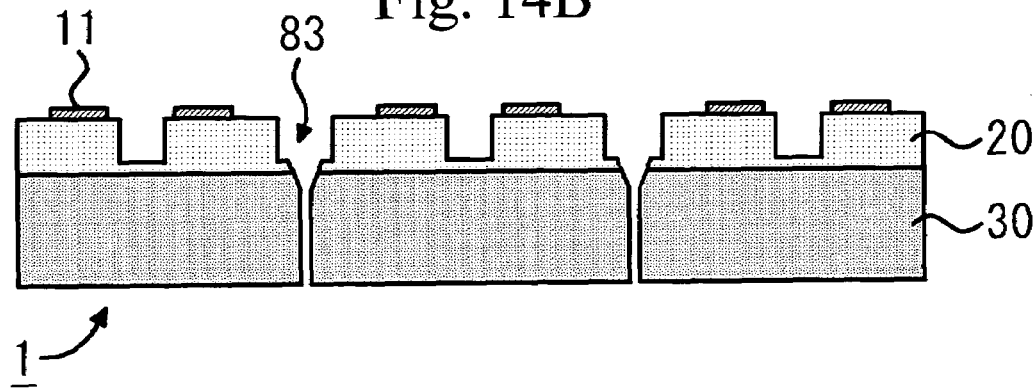

After the piezoelectric substrate 20 is removed except the several micronmeters on the supporting substrate 30, a thinner laser beam than the grooves 83 is used to cut the supporting substrate 30 through the bottom of each groove 83 along the boundary lines of the individual SAW device chips 2, as shown in FIG. 13B. By doing so, the individual SAW device chips 2 can be obtained, while separation of the joining interface is prevented in the vicinity of the dicing lines. In this embodiment, a dicing blade, instead of a laser beam, may be used to cut the supporting substrate 30 and the remains of the piezoelectric substrate 20, as long as the dicing blade is thinner than the grooves 83. As the small portions of the piezoelectric substrate 20 are left on the dicing lines, even if the supporting substrate 30 is cut with a dicing blade or the like, separation of the joining interface can be restricted to the bottoms of the grooves 83 on which the thin portions of the piezoelectric substrate 20 remain and reduce the joining strength. Also, a scriber may be used to form scratches 84 that are deep enough to reach the supporting substrate 30 along the boundary lines of the SAW device chips 2, as shown in FIG. 14A. A breaker is then used to break the supporting substrate 30 along the scratches 84 formed with the scriber, so that the individual SAW device chips 2 can be obtained. Like the method of the first embodiment, a diamond needle having the top end thinner than the grooves 83 is employed for the scriber.

As described above, it is possible to physically separate the resonators 10 that have overlapping areas in the SAW propagating direction from each other in accordance with this embodiment. Accordingly, bulk waves cannot enter the overlapping areas among the resonators 10, and generation of spurious waves is prevented. Thus, excellent filter characteristics can be obtained. Also, this embodiment employs a two-stage substrate dicing procedure, and a laser beam is used to dice the supporting substrate. Even if the supporting substrate is made of a harder material than the piezoelectric substrate, the dicing speed can be easily controlled, and separation of the joining interface in the vicinity of the dicing areas and a decrease of the life of a dicing blade can be prevented. Thus, SAW device chips can be efficiently mass produced with high yield. Furthermore, even when the supporting substrate is cut with a dicing blade, separation of the piezoelectric substrate and the supporting substrate can be restricted to the thin-filmed portions (i.e., the grooves 83). Thus, a sufficient joining strength can be maintained, and a decrease of the temperature stability can be prevented.

The other aspects and the other production procedures in accordance with this embodiment are the same as those in accordance with the first embodiment, and therefore, explanation of them is omitted herein.

(Third Embodiment)

Figure 15A:
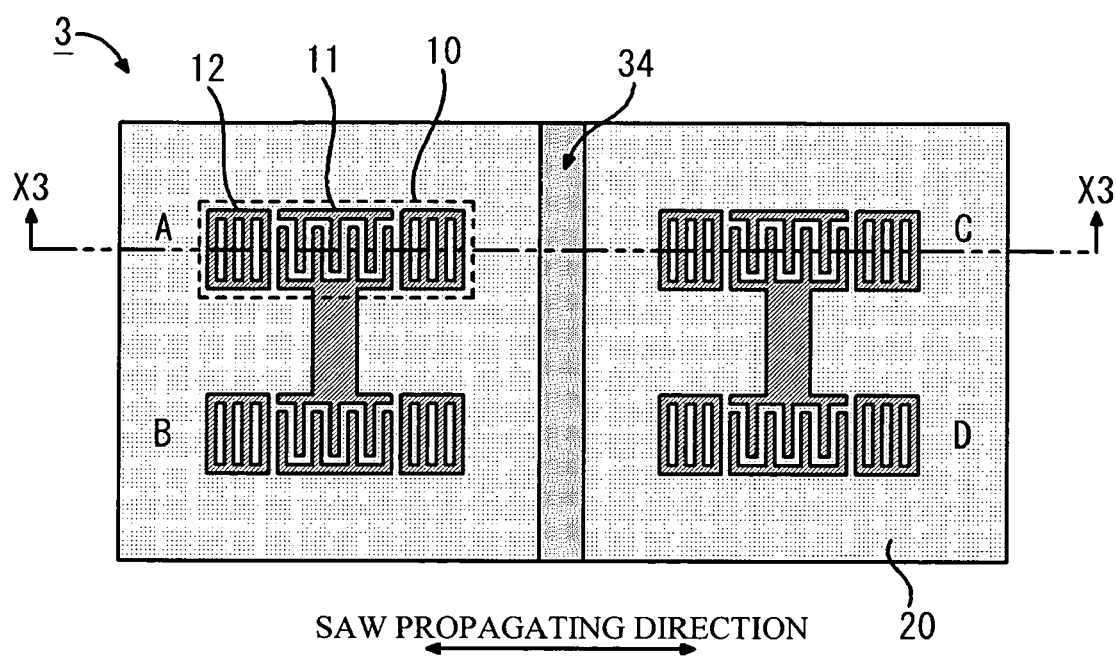
FIG. 15A is a top view of a SAW device chip in accordance with a third embodiment of the present invention.
Figure 15B:
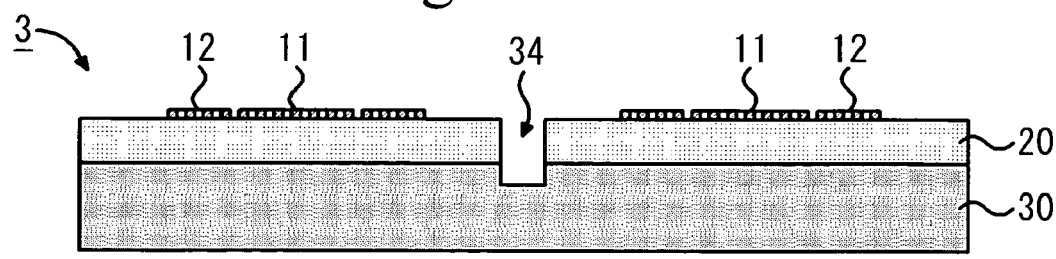
FIG. 15B is a section view of the SAW device chip, taken along the line X3—X3 of FIG. 15A.

Next, a third embodiment of the present invention will be described in detail, with reference to the accompanying drawings. FIGS. 15A and 15B illustrate a SAW device chip 3 in accordance with this embodiment. FIG. 15A is a top view of the SAW device chip 3, and FIG. 15B is a section view of the SAW device chip 3, taken along the line X3—X3 of FIG. 15A.

As shown in FIGS. 15A and 15B, the SAW device chip 3 has grooves 34 formed between each two neighboring resonators 10 (between the resonators A and C, and between the resonators B and D) that overlap each other in the SAW propagating direction. The SAW device chip 3 has the same structure as the SAW device chip 1 of the first embodiment shown in FIGS. 3A and 3B, except that the grooves 34 penetrate through the piezoelectric substrate 20 and reach the supporting substrate 30. In this embodiment, the grooves 34 are formed by removing the supporting substrate 30 by a depth of several micrometers to tens of micrometers (10 μm, for example), as well as the piezoelectric substrate 20. The largest possible amount of the supporting substrate 30 that can be removed is defined as such an amount that can maintain the strength of the supporting substrate 30 and does not reduce the durability and the temperature stability of the SAW device chip 3.

As described above, even if the supporting substrate 30 is partially removed as well as the piezoelectric substrate 20, separation of the joining interface can be prevented, as long as the strength of the supporting substrate 30 is maintained. Thus, the individual SAW device chips 3 can be obtained without separation of the joining interface. The other aspects and the manufacturing method in accordance with this embodiment are the same as those in accordance with the first embodiment, and therefore, explanation of them is omitted herein.

(Fourth Embodiment)

Figure 16A:
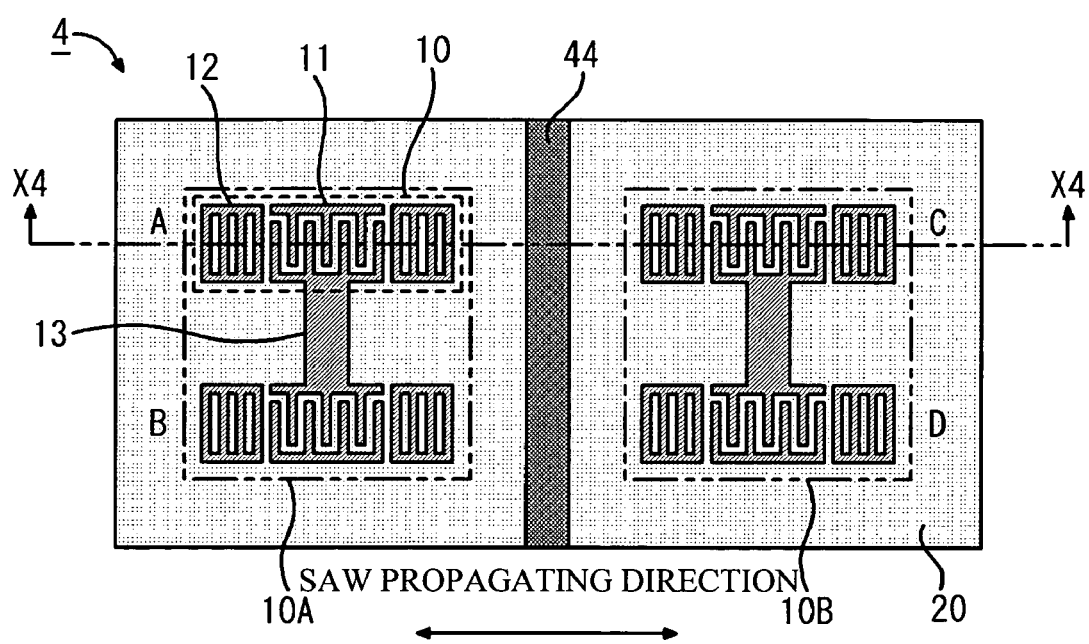
FIG. 16A is a top view of a SAW device chip in accordance with a fourth embodiment of the present invention.
Figure 16B:
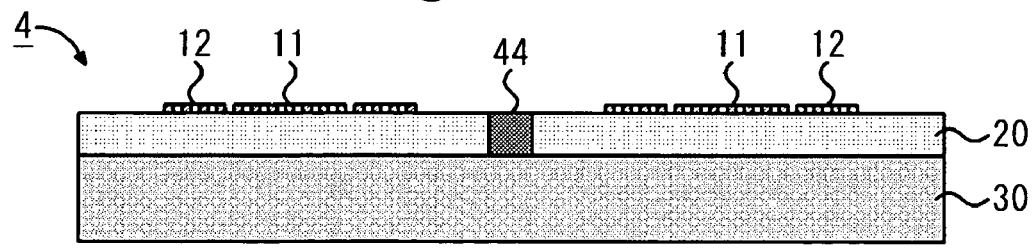
FIG. 16B is a section view of the SAW device chip, taken along the line X4—X4 of FIG. 16A.

Next, a fourth embodiment of the present invention will be described in detail, with reference to the accompanying drawings. FIGS. 16A and 16B illustrate a SAW device chip 4 in accordance with this embodiment. FIG. 16A is a top view of the SAW device chip 4, and FIG. 16B is a section view of the SAW device chip 4, taken along the line X4—X4 of FIG. 16A.

As shown in FIGS. 16A and 16B, the SAW device chip 4 in accordance with this embodiment includes modified portions 44 that are formed by modifying the properties of the piezoelectric substrate 20 at the removed portions (the grooves 4 in FIGS. 3A and 3B) of the first embodiment. The modified portions 44 eliminate the continuity of the piezoelectric substrate 20, and accordingly, propagation of bulk waves can be prevented.

The property of the piezoelectric substrate 20 can be modified with a laser beam or the like. A laser beam is irradiated onto the portions to be modified, so as to cause melting or multi-photon absorption at the portions to be modified. Thus, the characteristic continuity of the piezoelectric substrate 20 disappears, and accordingly, bulk waves cannot be propagated from a resonator 10 to another resonator 10, and generation of spurious waves can be restricted. Also, the piezoelectric substrate 20 is not physically removed in this embodiment. Accordingly, a decrease of the joining strength between the piezoelectric substrate 20 and the supporting substrate 30 can be prevented, and a decrease of the temperature stability of the SAW device chip 4 can also be avoided. After the modified portions 44 are formed, cracks may appear in the modified layer of the piezoelectric substrate 20 due to thermal stress caused by a change of the temperature of the SAW device chip 4. In such a case, the cracks serve to divide the piezoelectric substrate 20 in the same manner as in the first embodiment, though the cracks are very narrow as grooves. As a result, propagation of bulk waves can be further restricted.

A method of manufacturing SAW device chips 4 in accordance with this embodiment will now be described in detail, with reference to the accompanying drawings.

Figure 17A:
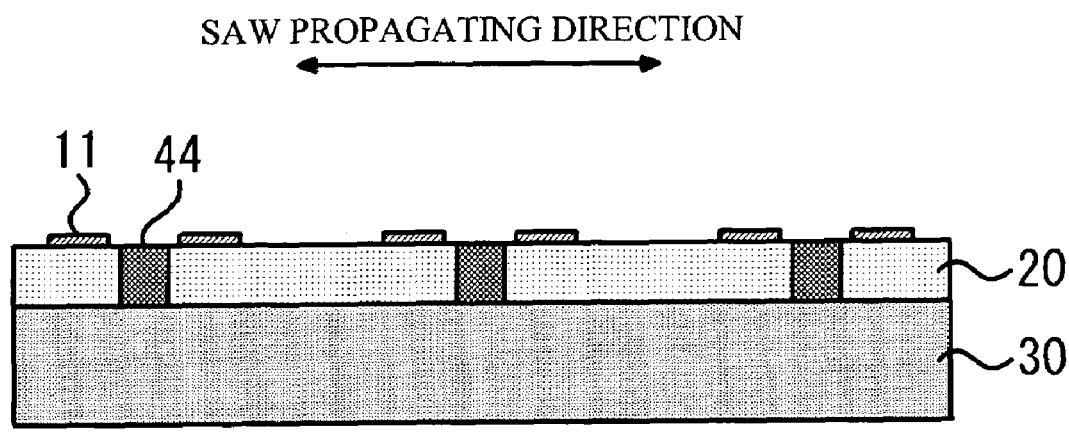
FIGS. 17A through 17C illustrate production procedures in a method of manufacturing SAW device chips in accordance with the fourth embodiment of the present invention.
Figure 17B:
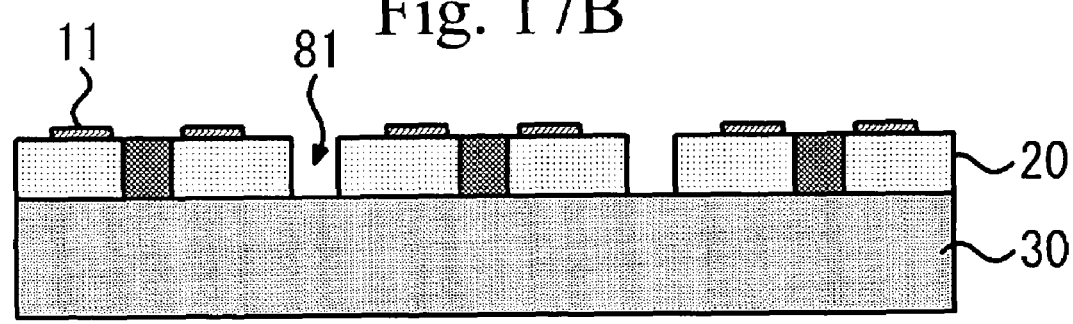
Figure 17C:
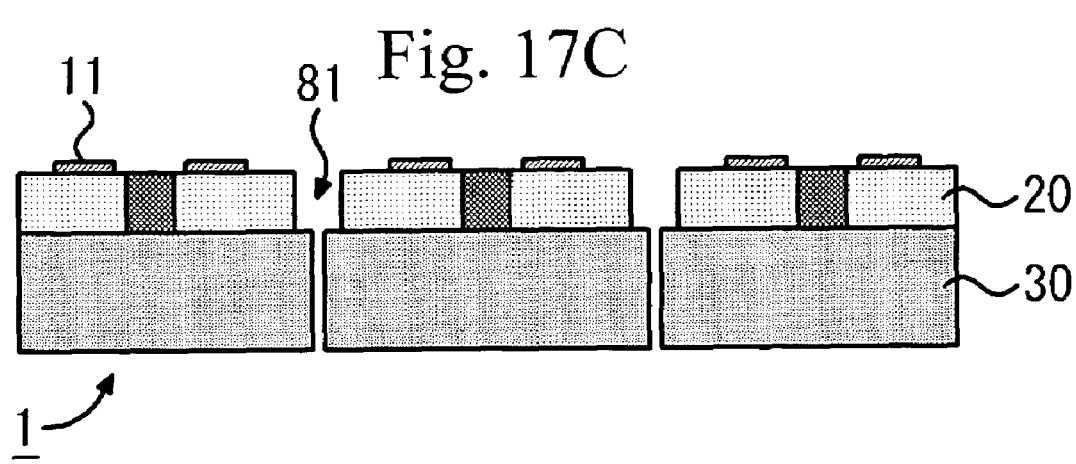

FIGS. 17A through 17C illustrate the procedures in the method of manufacturing the SAW device chips 4. Like the manufacturing method in accordance with the first embodiment, this manufacturing method also involves a multiple structure so as to increase the productivity and to reduce the production cost per chip.

In this manufacturing method, a joined substrate (a base substrate) that includes the piezoelectric substrate 20 having the IDTs 11 and other components formed thereon and the supporting substrate 30 is first produced through the same procedures as those of FIGS. 6A through 6D.

So as to eliminate the continuity between each two neighboring resonators 10 overlapping each other in the SAW propagating direction, a laser beam is emitted onto the regions to be the modified portions 44, as shown in FIG. 17A. When the base substrate is to be divided into the individual SAW device chips 4, the piezoelectric substrate 20 is cut (removed) along the boundary lines (the dicing lines) of the individual SAW device chips 4 with a dicing blade, as shown in FIG. 17B. Using a laser beam, the supporting substrate 30 and the bottoms of the grooves 81 are cut along the boundary lines of the individual SAW device chips 4, as shown in FIG. 17C. In this manner, the individual SAW device chips 4 can be obtained, while separation of the joining interface in the vicinity of the dicing areas is prevented. The other aspects and the other production procedures in accordance with this embodiment are the same as those in accordance with the first embodiment, and therefore, explanation of them is omitted herein.

Although the modifying of the piezoelectric substrate 20 between each two neighboring resonators 10 overlapping each other in the SAW propagating direction is performed from the upper surface toward the lower surface, the present invention is not limited to this manner. The resonators 10 can also be separated from each other by modifying the properties of the portions that do not reach the bottom surface (on the supporting substrate 30) of the piezoelectric substrate 20, such as the grooves 24 of the second embodiment, or by modifying the properties of the portions that penetrate into the upper layer of the supporting substrate 30, such as the grooves 34 of the third embodiment.

(Fifth Embodiment)

Figure 18A:
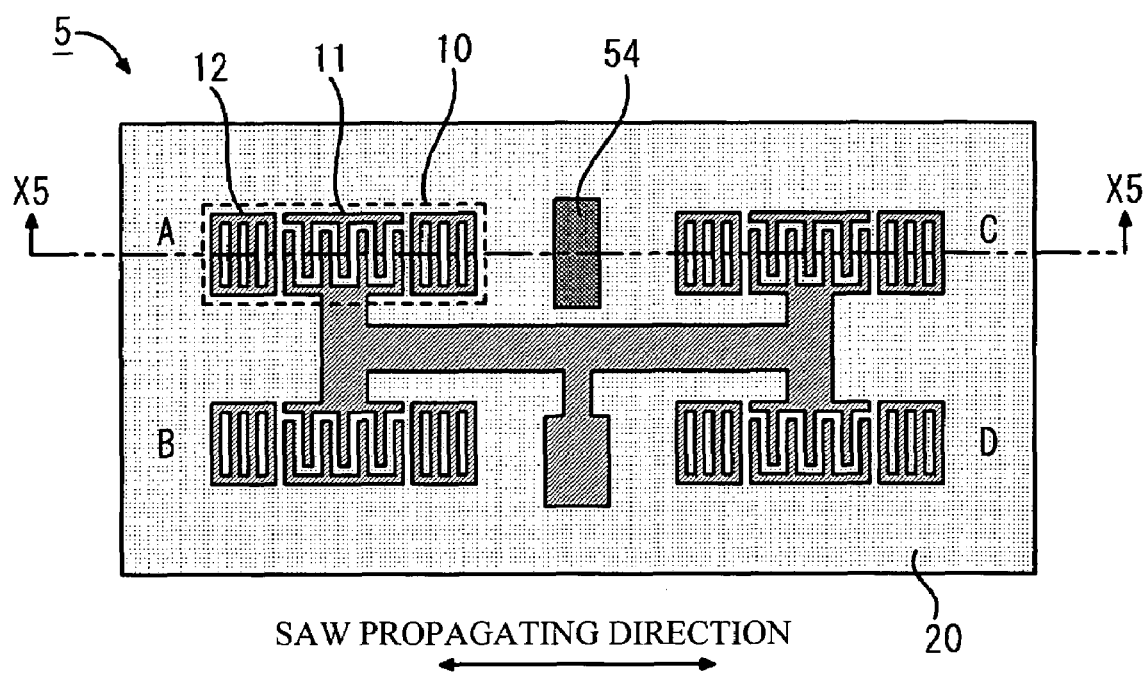
FIG. 18A is a top view of a SAW device chip in accordance with a fifth embodiment of the present invention.
Figure 18B:
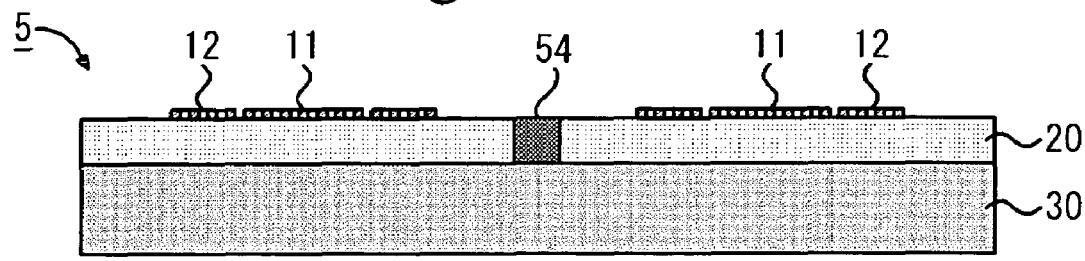
FIG. 18B is a section view of the SAW device chip, taken along the line X5—X5 of FIG. 18A.

Next, a fifth embodiment of the present invention will be described in detail, with reference to the accompanying drawings. FIGS. 18A and 18B illustrate a SAW device chip 5 in accordance with this embodiment. FIG. 18A is a top view of the SAW device chip 5, and FIG. 18B is a section view of the SAW device chip 5, taken along the line X5—X5 of FIG. 18A.

As shown in FIGS. 18A and 18B, the SAW device chip 5 includes modified portions that are formed by modifying the properties of the piezoelectric substrate 20 only at a part of the region between each two neighboring resonators 10 overlapping each other in the SAW propagating direction (at least at the overlapping portions of the resonators 10 in the SAW propagating direction).

A laser beam is used to partially modify the properties of the piezoelectric substrate 20, so that a modified portion 54 can be formed only in the region between each two neighboring resonators 10 overlapping each other in the SAW propagating direction. The modified portion 54 does not extend along the entire surface of the SAW device chip 5. In this manner, the SAW device chip 5 has the piezoelectric substrate 20 partially divided to cut off bulk waves. The other aspects and the manufacturing method in accordance with this embodiment are the same as those in accordance with the fourth embodiment, and therefore, explanation of them is omitted herein.

Figure 19A:
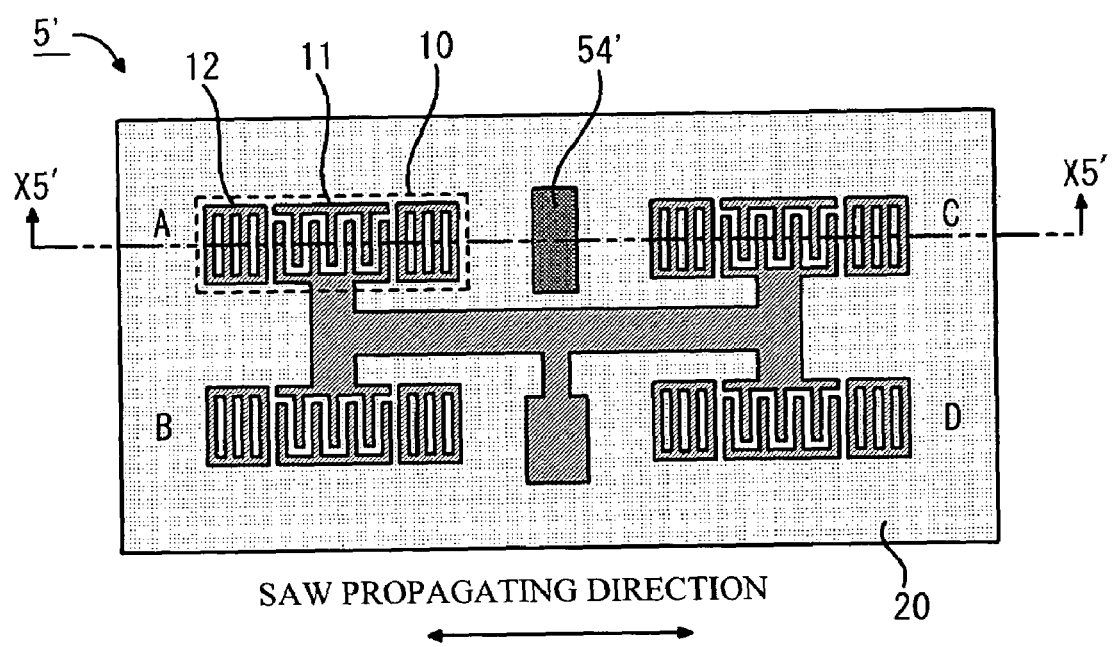
FIG. 19A is a top view of another SAW device chip in accordance with the fifth embodiment of the present invention.
Figure 19B:
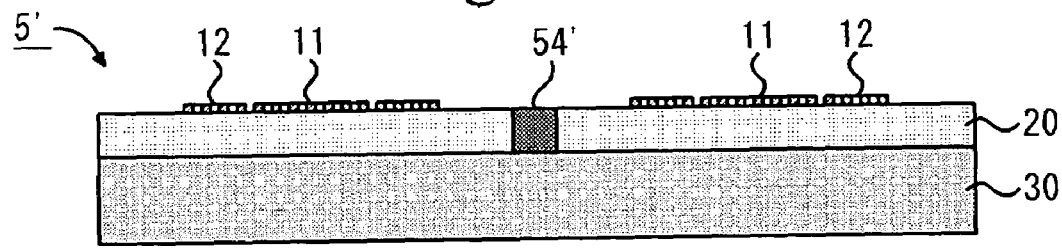
FIG. 19B is a section view of the SAW device chip, taken along the line X5'—X5' of FIG. 19A.

Although the piezoelectric substrate is partially modified in the above description, it is also possible to form a groove 54' by removing the portion corresponding to the modified portion 54 with a laser beam or the like, as shown in FIGS. 19A and 19B. With the groove 54', the piezoelectric substrate 20 can also be partially divided to cut off bulk waves. Thus, a SAW device chip 5' that can restrict generation of spurious waves from bulk waves can be obtained.

(Sixth Embodiment)

Figure 20:
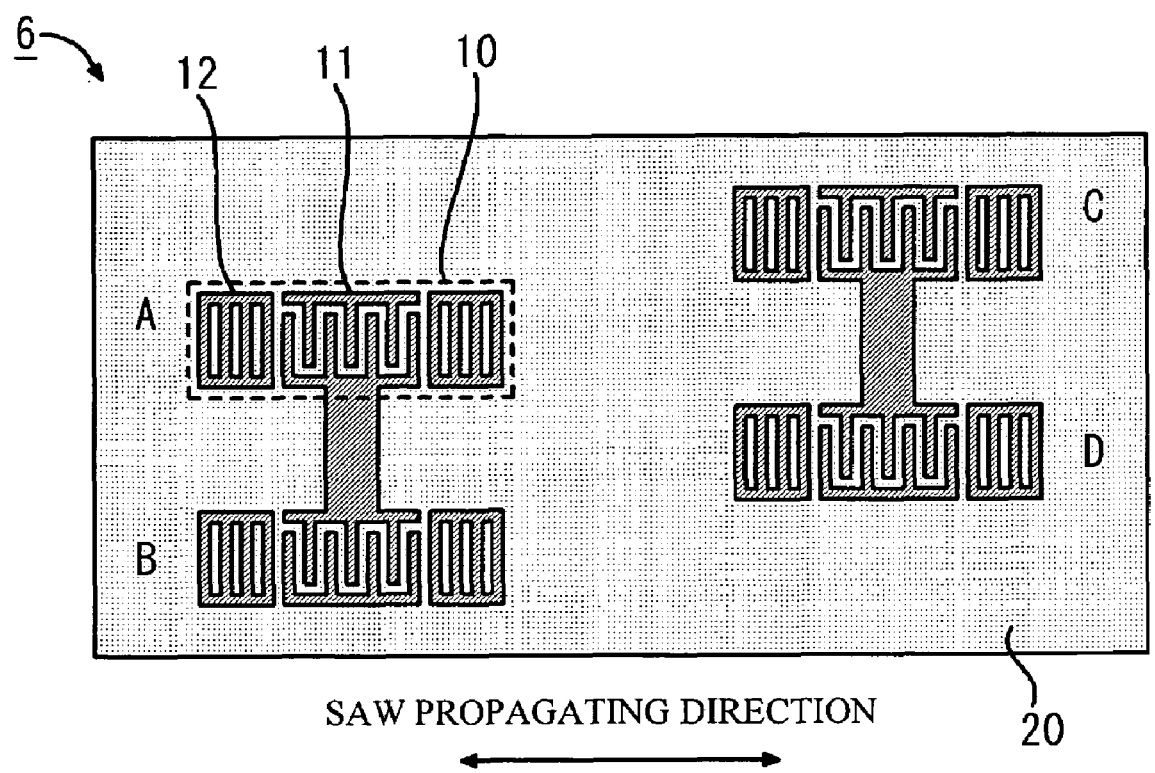
FIG. 20 is a top view of a SAW device chip in accordance with a sixth embodiment of the present invention.

Next, a sixth embodiment of the present invention will be described in detail, with reference to the accompanying drawings. FIG. 20 is a top view of a SAW device chip 6 in accordance with this embodiment.

As shown in FIG. 20, the SAW device chip 6 has the IDTs 11 arranged on the piezoelectric substrate 20 so as not to overlap one another in the SAW propagating direction. More specifically, the resonators 10 of the SAW device chip 6 do not overlap one another in the SAW propagating direction. Bulk waves are normally propagated in the SAW propagating direction, having components in the depth direction of the piezoelectric substrate 20. Therefore, the overlapping portions of the resonators 10 in the SAW propagating direction are eliminated, so that bulk waves outputted from a resonator 10 cannot enter another resonator 10. Thus, generation of spurious waves can be restricted.

In the SAW device chip 6, the IDTs 11 and the wiring patterns 13 that are formed through the procedures shown in FIGS. 6C and 6D are arranged as shown in FIG. 20. Accordingly, the procedure of forming the grooves 4 shown in FIG. 6E can be omitted.

Figure 21A:
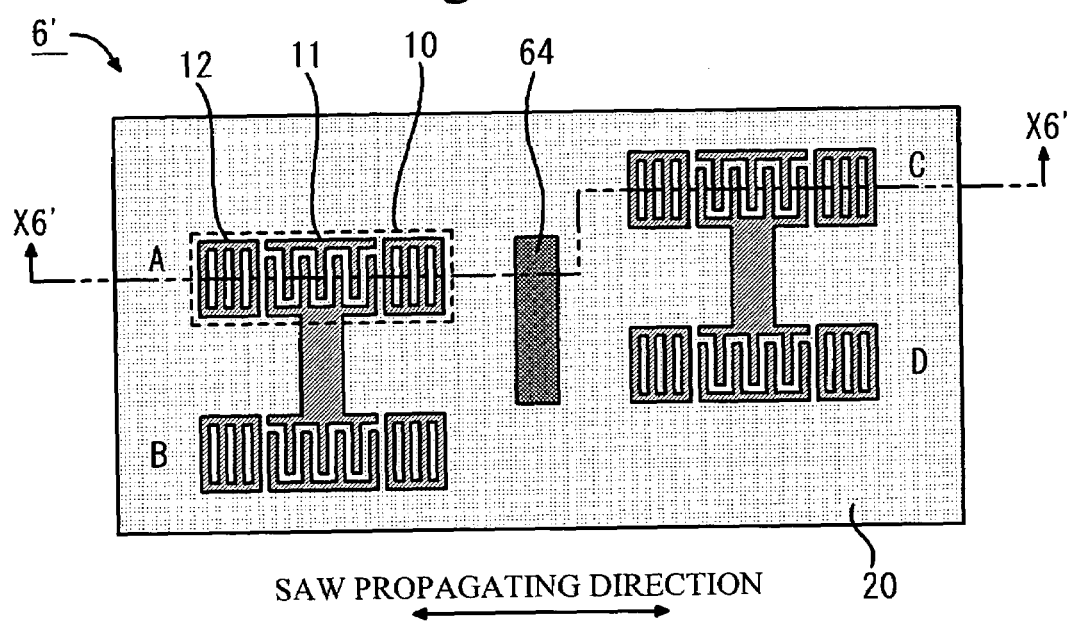
FIG. 21A is a top view of another SAW device chip in accordance with the sixth embodiment of the present invention.
Figure 21B:
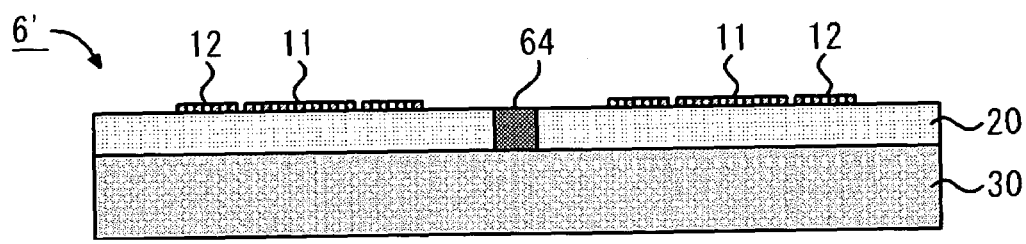
FIG. 21B is a section view of the SAW device chip, taken along the line X6'—X6' of FIG. 21A.

In the above structure, a modified portion 64' (or a groove) that partially cuts the region between each two neighboring resonators 10 (not necessarily having overlapping portions) in the SAW propagating direction may also be formed, as shown in FIGS. 21A and 21B illustrating a SAW device chip 6'. With the modified portion 64', adverse influence of bulk waves can be further reduced, and generation of spurious waves can be further restricted.

Figure 22A:
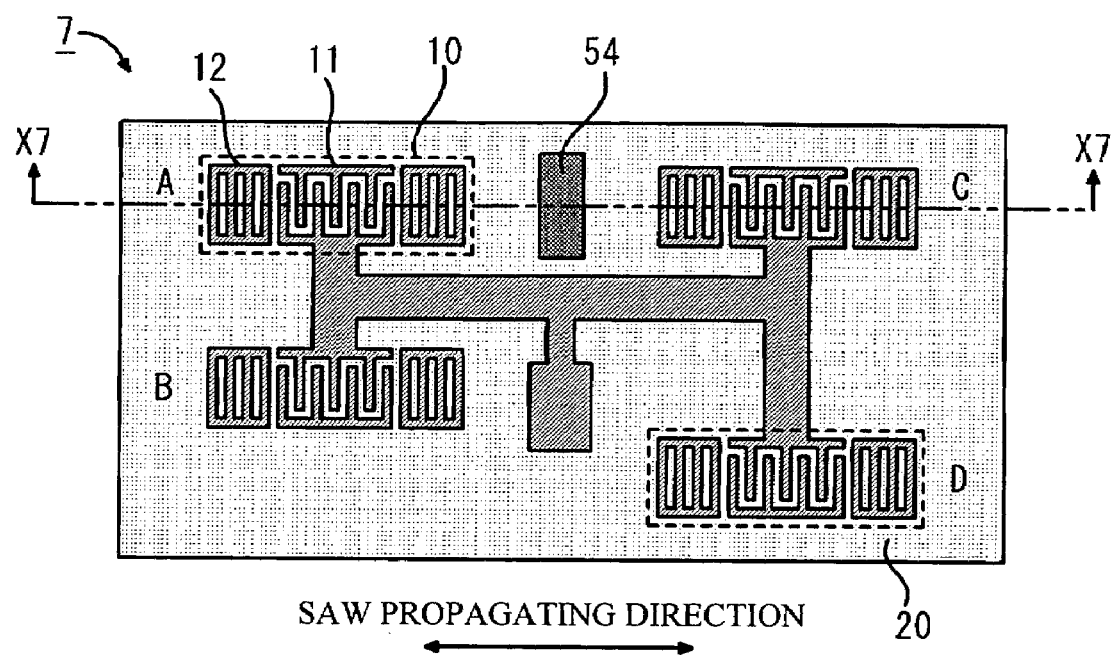
FIG. 22A is a top view of yet another SAW device chip in accordance with the sixth embodiment of the present invention.
Figure 22B:
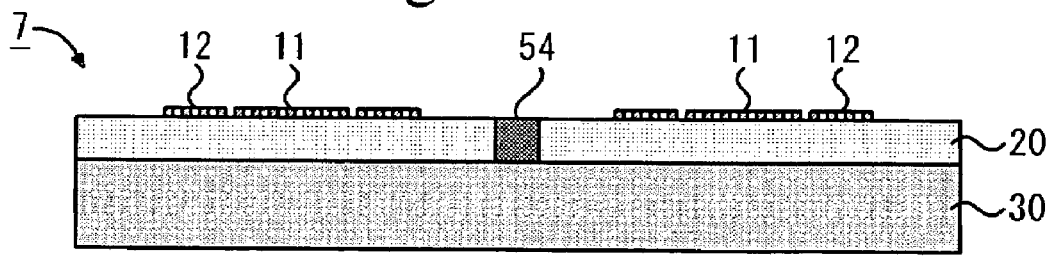
FIG. 22B is a section view of the SAW device chip, taken along the line X7—X7 of FIG. 22A.

Further, this embodiment may be combined with the SAW device chip 5 in accordance with the fifth embodiment shown in FIGS. 18A and 18B, so as to form a SAW device chip 7 shown in FIGS. 22A and 22B. As shown in FIGS. 22A and 22B, the SAW device chip 7 has a pair of resonators 10 that are arranged not to overlap each other in the SAW propagating direction, and a groove or a modified portion cannot be formed between the pair of resonators 10 not having overlapping portions. With this arrangement, adverse influence of bulk waves can be minimized even in the SAW device chip 7 having a wiring pattern 13 extending in the SAW propagating direction between the resonators 10.

The other aspects and the production procedures in accordance with this embodiment are the same as those in accordance with any of the foregoing embodiments, and therefore, explanation of them is omitted herein.

(Other Embodiments)

The present invention is not limited to the above embodiments, and various changes and modifications may be made to those embodiments without departing from the scope of the present invention.

Although the supporting substrate 30 is a R-plane cut sapphire substrate in each of the above embodiments, an A-plane cut sapphire substrate may be employed, instead of the R-plane cut sapphire substrate.

Figure 23:
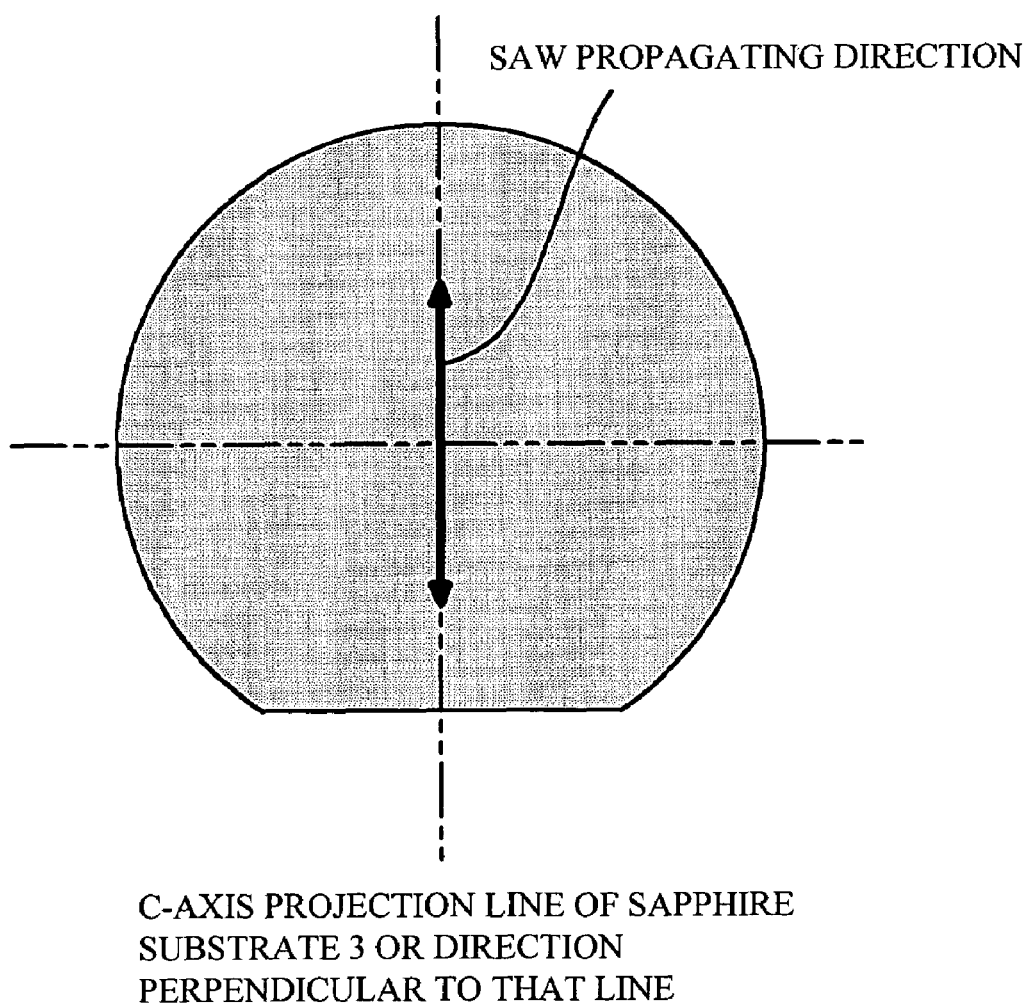
FIG. 23 illustrates a sapphire substrate to be employed in the present invention.

In a SAW device chip, a rectangular sapphire substrate that is obtained by dicing a wafer in the direction parallel to the SAW propagating direction and in the direction perpendicular to the SAW propagating direction is normally employed. Accordingly, in a case where the SAW propagating direction on the piezoelectric substrate 20 is parallel or perpendicular to the c-axis projection line of a sapphire substrate 3, as shown in FIG. 23, it is difficult to dice the sapphire substrate 3.

Figure 24:
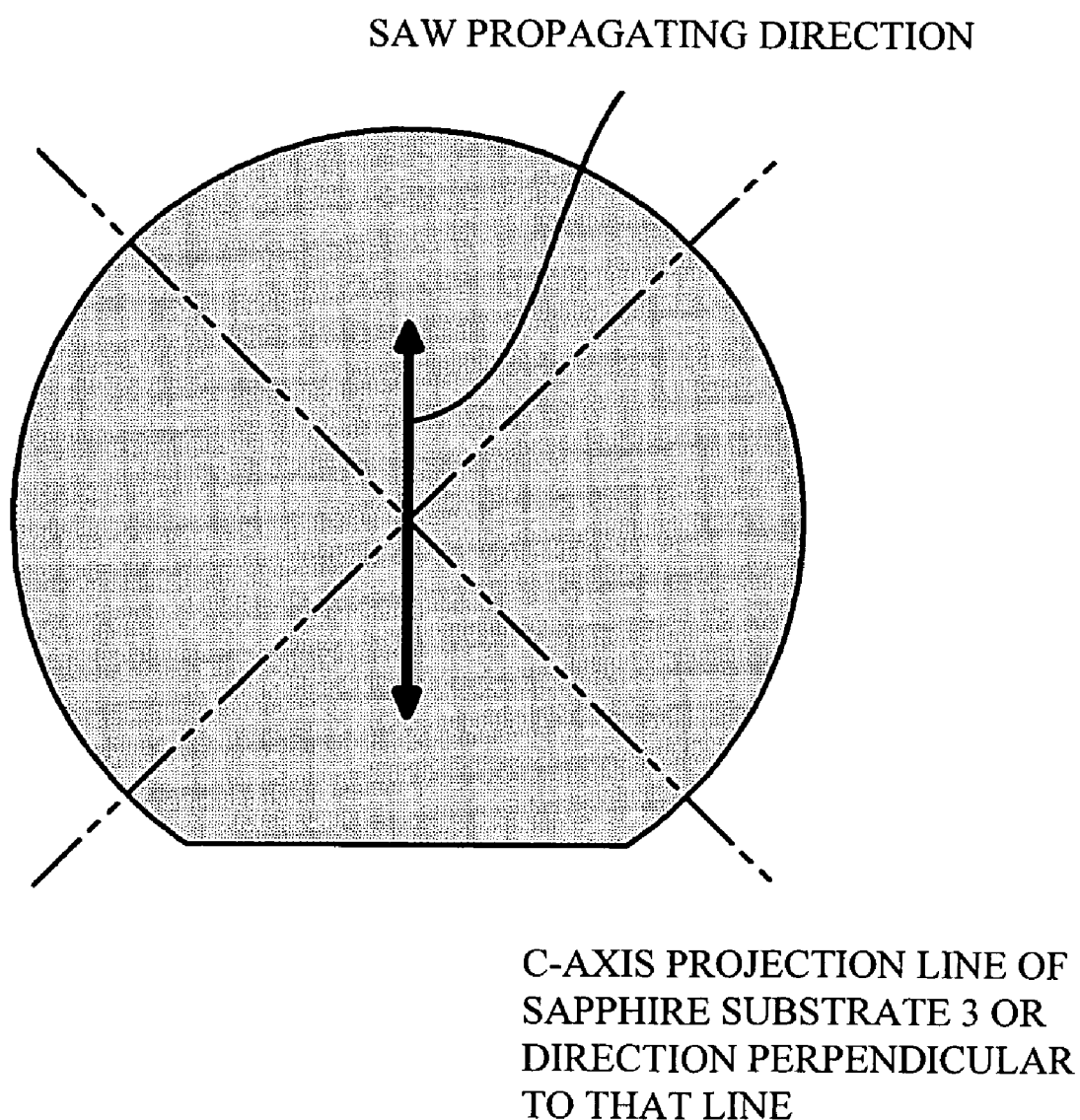
FIG. 24 illustrates another sapphire substrate to be employed in the present invention.

So as to eliminate this problem, the sapphire substrate dicing direction is different from the direction parallel to the c-axis projecting direction and the direction perpendicular to the c-axis projecting direction. Referring to FIG. 24, this structure will be described below.

As shown in FIG. 24, the SAW propagating direction on the piezoelectric substrate 20 is set at an angle of 45 degrees with respect to the c-axis projecting direction of the sapphire substrate 3. By doing so, the dicing direction of the sapphire substrate 3 also meets the c-axis projection line at an angle of 45 degrees. Accordingly, the dicing process can be easily carried out, and SAW devices with uniform characteristics can be obtained. Since the sapphire substrate 3 is normally designed to allow for a margin of ±2 degrees, the angle with respect to the c-axis projecting line also allows for a margin of ±2 degrees.

The parameter values and the materials employed in the above embodiments are merely examples, and various changes and modifications may be made to the present invention without departing from the scope of the invention. Also, the present invention can be applied not only to a SAW device that forms only one resonator but also to a ladder filter or a multi-mode coupled filter that include two or more resonators. The present invention may also be applied to a duplexer and a dual filter that includes such a ladder filter or a multi-mode coupled filter.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A surface acoustic wave device comprising:
   a piezoelectric substrate that has two or more resonators formed on a surface; and
   a supporting substrate that is joined to another surface of the piezoelectric substrate,
   at least two of the resonators having exciting portions that overlap each other in the direction of propagating surface acoustic waves, and
   the piezoelectric substrate and the supporting substrate having removed or modified portions, thereby resulting in different properties between at least one pair of overlapping resonators among the resonators having the overlapping portions.

2. The surface acoustic wave device as claimed in claim 1, wherein the two or more resonators form two or more filters.

3. The surface acoustic wave device as claimed in claim 1, wherein the supporting substrate has a smaller thermal expansion coefficient than that of the piezoelectric substrate.

4. The surface acoustic wave device as claimed in claim 1, wherein the supporting substrate contains sapphire as a main component.

5. The surface acoustic wave device as claimed in claim 1, wherein the surface acoustic waves are leaky surface waves.

6. A surface acoustic wave device comprising:
   a piezoelectric substrate that has two or more resonators formed on a surface; and a supporting substrate that is joined to another surface of the piezoelectric substrate, all of the resonators having exciting portions that do not overlap each other in the direction of propagating surface acoustic waves, and at least a part of the piezoelectric substrate being removed or modified to have different properties between at least one pair of resonators among the resonators.

* * * * *